US012733144B2

(12) United States Patent
Lee et al.

(10) Patent No.: US 12,733,144 B2
(45) Date of Patent: Sep. 8, 2026

(54) ELECTRONIC DEVICE COMPRISING CONDUCTIVE CONNECTOR

(71) Applicant: Samsung Electronics Co., Ltd., Suwon-si (KR)

(72) Inventors: Daekyu Lee, Suwon-si (KR); Jongwoon Lee, Suwon-si (KR); Jongik Won, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 231 days.

(21) Appl. No.: 18/758,676

(22) Filed: Jun. 28, 2024

(65) Prior Publication Data

US 2025/0016967 A1 Jan. 9, 2025

Related U.S. Application Data

(63) Continuation of application No. PCT/KR2024/006399, filed on May 10, 2024.

(30) Foreign Application Priority Data

Jul. 6, 2023 (KR) ........................ 10-2023-0087764
Oct. 4, 2023 (KR) ........................ 10-2023-0131849

(51) Int. Cl.

| | |
|---|---|
| ***H02H 9/00*** | (2006.01) |
| ***H01R 4/64*** | (2006.01) |
| ***H05K 5/02*** | (2006.01) |
| ***H05K 9/00*** | (2006.01) |
| *H05K 5/00* | (2006.01) |

(52) U.S. Cl.
CPC ............ *H05K 9/0067* (2013.01); *H01R 4/64* (2013.01); *H05K 5/0247* (2013.01); *H05K 5/0026* (2013.01)

(58) Field of Classification Search
CPC .................................................... H03K 9/0067
See application file for complete search history.

(56) References Cited

U.S. PATENT DOCUMENTS 9,596,748 B2 * 3/2017 Lim ..................... H05K 1/0215
9,930,229 B2 * 3/2018 Zhao ...................... H05K 1/181
2011/0090622 A1 * 4/2011 Wang ...................... H05K 5/02
361/679.01

(Continued)

FOREIGN PATENT DOCUMENTS

EP 4 149 213 A1 3/2023
KR 10-2017-0014122 A 2/2017

(Continued)

OTHER PUBLICATIONS

International Search Report with English translation dated Aug. 21, 2024; International Appln. No. PCT/KR0204/006399.

*Primary Examiner* — Stephen W Jackson
(74) *Attorney, Agent, or Firm* — Jefferson IP Law, LLP

(57) ABSTRACT

An electronic device is provided. The electronic device includes a housing including a main body and a cover plate, a base plate disposed on the main body, a camera flange disposed on the base plate, a cover frame configured to cover the camera flange, a plurality of lens structures including an outer lens structure connected to the cover frame and an inner lens structure connected to the camera flange, and a first conductive connector disposed between the cover frame and the camera flange.

20 Claims, 11 Drawing Sheets

(56) References Cited

U.S. PATENT DOCUMENTS

| | | | | |
|---|---|---|---|---|
| 2018/0227466 | A1* | 8/2018 | Park | H04N 7/18 |
| 2019/0208638 | A1* | 7/2019 | Jung | H05K 1/181 |
| 2022/0286543 | A1* | 9/2022 | Hale | H04M 1/0249 |
| 2023/0163445 | A1* | 5/2023 | Suh | H01Q 1/243<br>343/702 |
| 2023/0292479 | A1* | 9/2023 | Kim | H04N 23/52 |
| 2024/0196078 | A1* | 6/2024 | Dong | H04N 23/52 |

FOREIGN PATENT DOCUMENTS

| | | | |
|---|---|---|---|
| KR | 10-2019-0082475 | A | 7/2019 |
| KR | 10-2021-0046369 | A | 4/2021 |
| KR | 10-2021-0155598 | A | 12/2021 |
| KR | 10-2023-0004331 | A | 1/2023 |
| KR | 10-2023-0021552 | A | 2/2023 |
| KR | 10-2023-0028962 | A | 3/2023 |
| KR | 10-2023-0079983 | A | 6/2023 |

* cited by examiner 365
301
320
301
365
310
320
313a
310
301
323a
365
323b
313b
301
320
310
365
301
341
310
365
313c
323c
301
X
Y

ELECTRONIC DEVICE COMPRISING CONDUCTIVE CONNECTOR

CROSS-REFERENCE TO RELATED APPLICATION(S)

This application is a continuation application, claiming priority under § 365 (c), of an International application No. PCT/KR2024/006399, filed on May 10, 2024, which is based on and claims the benefit of a Korean patent application number 10-2023-0087764, filed on Jul. 6, 2023, in the Korean Intellectual Property Office, and of a Korean patent application number 10-2023-0131849, filed on Oct. 4, 2023, in the Korean Intellectual Property Office, the disclosure of each of which is incorporated by reference herein in its entirety.

BACKGROUND

1. Field

The disclosure relates to an electronic device. More particularly, the disclosure relates to an electronic device including a conductive connector.

2. Description of Related Art

An optical module, which may be referred to as a flash or strobe, may include a light-emitting element, such as a light-emitting diode (LED), configured to illuminate a space outside the light-emitting element. An electronic device including one or more camera modules and optical modules is being developed to support various capturing environments or conditions.

The size of an image sensor must be large to obtain high-resolution or high-definition photos. As the size of an image sensor increases, the size of an image increases, so it is necessary to secure a relatively long focal length of a lens. The long focal length of a lens means an increase in the length of a camera lens barrel. When the length of a camera lens barrel increases, the size of a camera module increases.

There is technology for maintaining the size of a terminal compact by partially protruding only a camera while maintaining the thickness of the terminal. A portion of a lens exposed to the outside may have sufficient rigidity, including a metallic material. Around a lens, a cover frame for protecting the lens may be provided.

The above information is presented as background information only to assist with an understanding of the disclosure. No determination has been made, and no assertion is made, whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device including a conductive connector.

Additional aspects will be set forth in part in the description which follows and, in part, will be apparent from the description, or may be learned by practice of the presented embodiments.

In accordance with an aspect of the disclosure, an electronic device is provided. The an electronic device includes a housing including a main body and a cover plate connected to the main body, a base plate disposed on the main body, a camera flange disposed on the base plate, a cover frame configured to cover the camera flange, a plurality of lens structures including outer lens structures connected to the cover frame and inner lens structures connected to the camera flange, and first conductive connectors disposed between the cover frame and the camera flange, provided in a state compressed by the cover frame and the camera flange, and electrically connecting the cover frame to the camera flange.

In accordance with another aspect of the disclosure, an electronic device is provided. The an electronic device includes a housing including a main body and a cover plate connected to the main body, a base plate disposed on the main body, a camera flange disposed on the base plate, a cover frame configured to cover the camera flange, a plurality of lens structures including outer lens structures connected to the cover frame and inner lens structures connected to the camera flange, and first conductive connectors disposed between the cover frame and the camera flange and provided in a state compressed by the cover frame and the camera flange, in which an electrostatic discharge is capable of being generated along the cover frame, the first conductive connectors, the camera flange, and the base plate.

In accordance with another aspect of the disclosure, an electronic device is provided. The electronic device includes a housing including a main body and a cover plate connected to the main body, a base plate disposed on the main body, a camera flange disposed on the base plate, a cover frame configured to cover the camera flange, a plurality of lens structures comprising outer lens structures connected to the cover frame and inner lens structures connected to the camera flange, and first conductive connectors disposed between the cover frame and the camera flange and provided in a state compressed by the cover frame and the camera flange, wherein an electrostatic discharge is capable of being generated along the cover frame, the first conductive connectors, the camera flange, and the base plate.

In accordance with another aspect of the disclosure, an electronic device is provided. The an electronic device includes a housing including a main body and a cover plate connected to the main body, a base plate disposed on the main body, a camera flange disposed on the base plate, a cover frame configured to cover the camera flange, a plurality of lens structures including outer lens structures connected to the cover frame and inner lens structures connected to the camera flange, and first conductive connectors disposed between the cover frame and the camera flange, having elasticity, provided in a state compressed by the cover frame and the camera flange, electrically connecting the cover frame to the camera flange, and having a ring shape, in which an electrostatic discharge is capable of being generated along the cover frame, the first conductive connectors, the camera flange, and the base plate.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that the blocks in each flowchart and combinations of the flowcharts may be performed by one or more computer programs which include computer-executable instructions. The entirety of the one or more computer programs may be stored in a single memory device or the one or more computer programs may be divided with different portions stored in different multiple memory devices.

Any of the functions or operations described herein can be processed by one processor or a combination of processors. The one processor or the combination of processors is circuitry performing processing and includes circuitry like an application processor (AP, e.g., a central processing unit (CPU)), a communication processor (CP, e.g., a modem), a graphical processing unit (GPU), a neural processing unit (NPU) (e.g., an artificial intelligence (AI) chip), a wireless-fidelity (Wi-Fi) chip, a Bluetooth™ chip, a global positioning system (GPS) chip, a near field communication (NFC) chip, connectivity chips, a sensor controller, a touch controller, a finger-print sensor controller, a display drive integrated circuit (IC), an audio CODEC chip, a universal serial bus (USB) controller, a camera controller, an image processing IC, a microprocessor unit (MPU), a system on chip (SoC), an IC, or the like.

Figure 1:
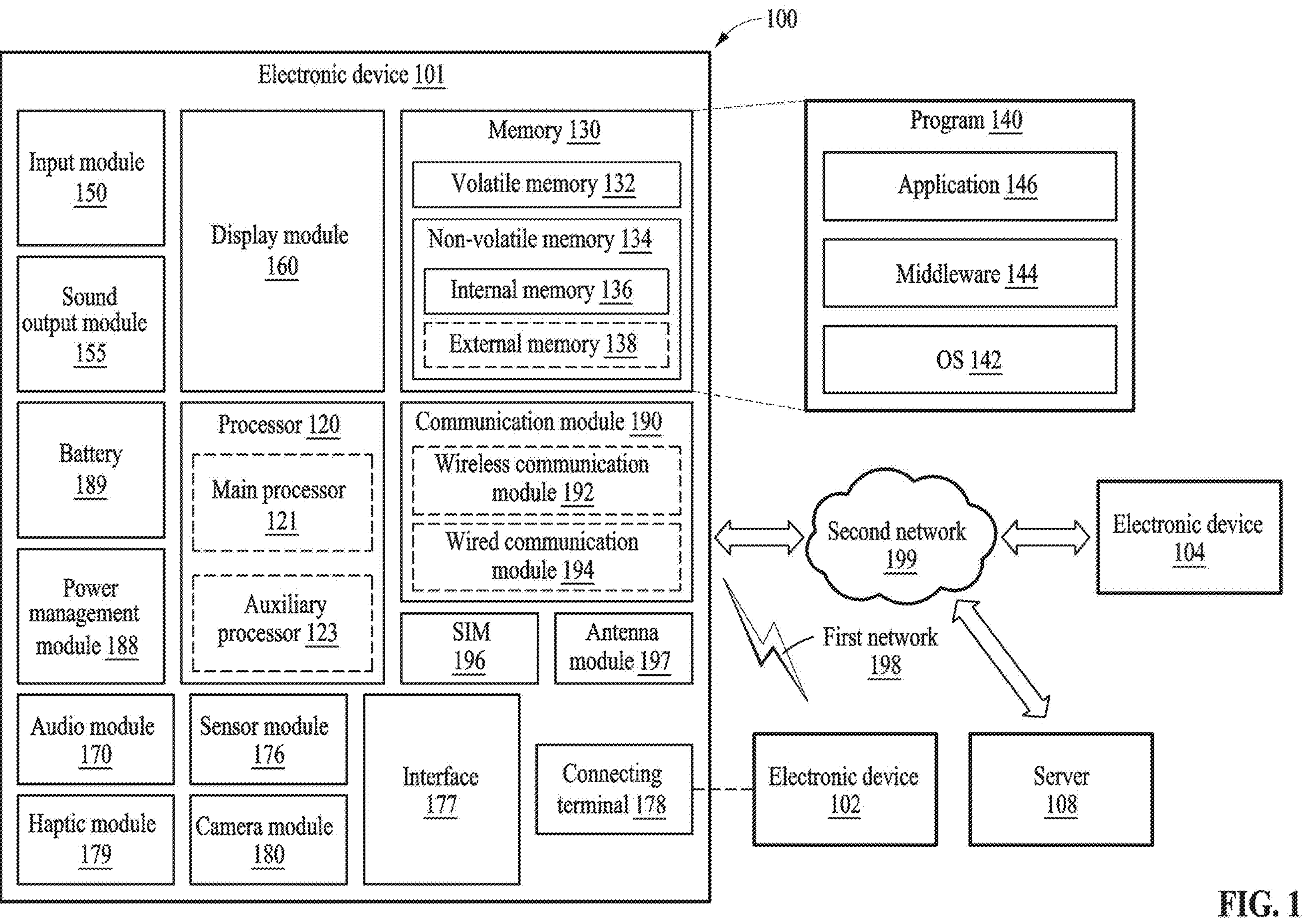
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or communicate with at least one of an external electronic device 104 and a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, memory 130, an input module 150, a sound output module 155, a display module 160, an audio module 170, and a sensor module 176, an interface 177, a connecting terminal 178, a haptic module 179, a camera module 180, a motor 187, a power management module 188, a battery 189, a communication module 190, a subscriber identification module (SIM) 196, or an antenna module 197. In an embodiment of the disclosure, at least one of the components (e.g., the connecting terminal 178) may be omitted from the electronic device 101, or one or more other components may be added to the electronic device 101. In an embodiment of the disclosure, some of the components (e.g., the sensor module 176, the camera module 180, or the antenna module 197) may be integrated as a single component (e.g., the display module 160).

The processor 120 may execute, for example, software (e.g., a program 140) to control at least one other component (e.g., a hardware or software component) of the electronic device 101 connected to the processor 120 and may perform various data processing or computations. According to an embodiment of the disclosure, as at least a part of data processing or computations, the processor 120 may store a command or data received from another component (e.g., the sensor module 176 or the communication module 190) in volatile memory 132, process the command or the data stored in the volatile memory 132, and store resulting data in non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an embodiment of the disclosure, the auxiliary processor 123 (e.g., an ISP or a CP) may be implemented as a portion of another component (e.g., the camera module 180 or the communication module 190) that is functionally related to the auxiliary processor 123. According to an embodiment of the disclosure, the auxiliary processor 123 (e.g., an NPU) may include a hardware structure specifically for artificial intelligence model processing. An artificial intelligence model may be generated by machine learning. The machine learning may be performed by, for example, the electronic device 101, in which artificial intelligence is performed, or performed via a separate server (e.g., the server 108). Learning algorithms may include, but are not limited to, for example, supervised learning, unsupervised learning, semi-supervised learning, or reinforcement learning. The artificial intelligence (AI) model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may additionally or alternatively include a software structure other than the hardware structure.

The memory 130 may store various pieces of data used by at least one component (e.g., the processor 120 or the sensor module 176) of the electronic device 101. The various pieces of data may include, for example, software (e.g., the program 140) and input data or output data for a command related thereto. The memory 130 may include the volatile memory 132 or the non-volatile memory 134.

The program 140 may be stored as software in the memory 130 and may include, for example, an operating system (OS) 142, middleware 144, or an application 146.

The input module 150 may receive, from outside (e.g., a user) the electronic device 101, a command or data to be used by another component (e.g., the processor 120) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing a recording. The receiver may be used to receive an incoming call. According to an embodiment of the disclosure, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control its corresponding one of the display, the hologram device, and the projector. According to an embodiment of the disclosure, the display module 160 may include a touch sensor adapted to detect a touch, or a pressure sensor adapted to measure the intensity of force of the touch.

The audio module 170 may convert sound into an electric signal or vice versa. According to an embodiment of the disclosure, the audio module 170 may obtain the sound via the input module 150 or output the sound via the sound output module 155 or an external electronic device (e.g., the external electronic device 102, such as a speaker or headphones) directly or wirelessly connected to the electronic device 101.

The sensor module 176 may detect an operational state (e.g., power or temperature) of the electronic device 101 or an environmental state (e.g., a state of a user) external to the electronic device 101 and generate an electric signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used by the electronic device 101 to couple with the external electronic device (e.g., the external electronic device 102) directly (e.g., by wire) or wirelessly. According to an embodiment of the disclosure, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may physically connect to an external electronic device (e.g., the external electronic device 102). According to an embodiment of the disclosure, the connecting terminal 178 may include, for example, an HDMI connector, a USB connector, an SD card connector, or an audio connector (e.g., a headphones connector).

The haptic module 179 may convert an electric signal into a mechanical stimulus (e.g., a vibration or a movement) or an electrical stimulus, which may be recognized by a user via their tactile sensation or kinesthetic sensation. According to an embodiment of the disclosure, the haptic module 179 may include, for example, a motor, a piezoelectric element, or an electric stimulator.

The camera module 180 may capture a still image and moving images. According to an embodiment of the disclosure, the camera module 180 may include one or more lenses, image sensors, ISPs, and flashes.

The power management module 188 may manage power supplied to the electronic device 101. According to an embodiment of the disclosure, the power management module 188 may be implemented as, for example, at least a part of a power management integrated circuit (PMIC).

The battery 189 may supply power to at least one component of the electronic device 101. According to an embodiment of the disclosure, the battery 189 may include, for example, a primary cell, which is not rechargeable, a secondary cell, which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more CPs that are operable independently from the processor 120 (e.g., an AP) and that support direct (e.g., wired) communication or wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device, for example, the external electronic device 104, via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., a LAN or a wide area network (WAN)). These various types of communication modules may be implemented as a single component (e.g., a single chip), or may be implemented as multiple components (e.g., multiple chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a millimeter wave (mmWave) band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beamforming, or a large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., a printed circuit board (PCB)). According to an embodiment of the disclosure, the antenna module 197 may include a plurality of antennas (e.g., an antenna array). In such a case, at least one antenna appropriate for a communication scheme used in a communication network, such as the first network 198 or the second network 199, may be selected by, for example, the communication module 190 from the plurality of antennas. The signal or power may be transmitted or received between the communication module 190 and the external electronic device via the at least one selected antenna. According to an embodiment of the disclosure, another component (e.g., a radio frequency integrated circuit (RFIC)) other than the radiating element may be additionally formed as a part of the antenna module 197.

According to an embodiment of the disclosure, the antenna module 197 may form a mmWave antenna module. According to an embodiment of the disclosure, the mmWave antenna module may include a PCB, an RFIC on a first surface (e.g., the bottom surface) of the PCB, or adjacent to the first surface of the PCB and capable of supporting a designated high-frequency band (e.g., a mmWave band), and a plurality of antennas (e.g., array antennas) disposed on a second surface (e.g., the top or a side surface) of the PCB, or adjacent to the second surface of the PCB and capable of transmitting or receiving signals of the designated high-frequency band.

At least some of the above-described components may be coupled mutually and exchange signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device (e.g., the external electronic device 104) via the server 108 coupled with the second network 199. Each of the external electronic devices (e.g., the external electronic device 102 or 104) may be a device of the same type as or a different type from the electronic device 101. According to an embodiment of the disclosure, all or some of operations to be executed by the electronic device 101 may be executed by one or more external electronic devices (e.g., the external electronic devices 102 and 104 and the server 108). For example, if the electronic device 101 needs to perform a function or a service automatically, or in response to a request from a user or another device, the electronic device 101, instead of, or in addition to, executing the function or the service, may request the one or more external electronic devices to perform at least part of the function or service. The one or more external electronic devices receiving the request may perform the at least part of the function or service, or an additional function or an additional service related to the request and may transfer a result of the performance to the electronic device 101. The electronic device 101 may provide the result, with or without further processing the result, as at least part of a response to the request. To that end, cloud computing, distributed computing, mobile edge computing (MEC), or client-server computing technology may be used, for example. The electronic device 101 may provide ultra low-latency services using, e.g., distributed computing or MEC. In an embodiment of the disclosure, the external electronic device (e.g., the external electronic device 104) may include an Internet-of-things (IoT) device. The server 108 may be an intelligent server using machine learning and/or a neural network. According to an embodiment of the disclosure, the external electronic device (e.g., the external electronic device 104) or the server 108 may be included in the second network 199. The electronic device 101 may be applied to intelligent services (e.g., a smart home, a smart city, a smart car, or healthcare) based on 5G communication technology or IoT-related technology.

The electronic device according to an embodiment may be one of various types of electronic devices. The electronic device may include, for example, a portable communication device (e.g., a smartphone), a computer device, a portable multimedia device, a portable medical device, a camera, a wearable device, or a home appliance device. According to an embodiment of the disclosure, the electronic device is not limited to those described above.

It should be understood that various embodiments of the disclosure and the terms used therein are not intended to limit the technological features set forth herein to particular embodiments and include various changes, equivalents, or replacements for a corresponding embodiment. In connection with the description of the drawings, like reference numerals may be used for similar or related components. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and do not limit the components in other aspects (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., by wire), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

An embodiment as set forth herein may be implemented as software (e.g., the program 140) including one or more instructions that are stored in a storage medium (e.g., the internal memory 136 or the external memory 138) that is readable by a machine (e.g., the electronic device 101). For example, a processor (e.g., the processor 120) of the machine (e.g., the electronic device 101) may invoke at least one of the one or more instructions stored in the storage medium and execute it. This allows the machine to be operated to perform at least one function according to the at least one instruction invoked. The one or more instructions may include code generated by a compiler or code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., compact disc read-only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to an embodiment of the disclosure, each component (e.g., a module or a program) of the above-described components may include a single entity or multiple entities, and some of the multiple entities may be separately disposed in different components. According to an embodiment of the disclosure, one or more of the above-described components may be omitted, or one or more other components may be added. Alternatively or additionally, a plurality of components (e.g., modules or programs) may be integrated into a single component. In such a case, according to an embodiment of the disclosure, the integrated component may still perform one or more functions of each of the plurality of components in the same or similar manner as they are performed by a corresponding one of the plurality of components before the integration. According to an embodiment of the disclosure, operations performed by the module, the program, or another component may be carried out sequentially, in parallel, repeatedly, or heuristically, or one or more of the operations may be executed in a different order or omitted, or one or more other operations may be added.

Figure 2:
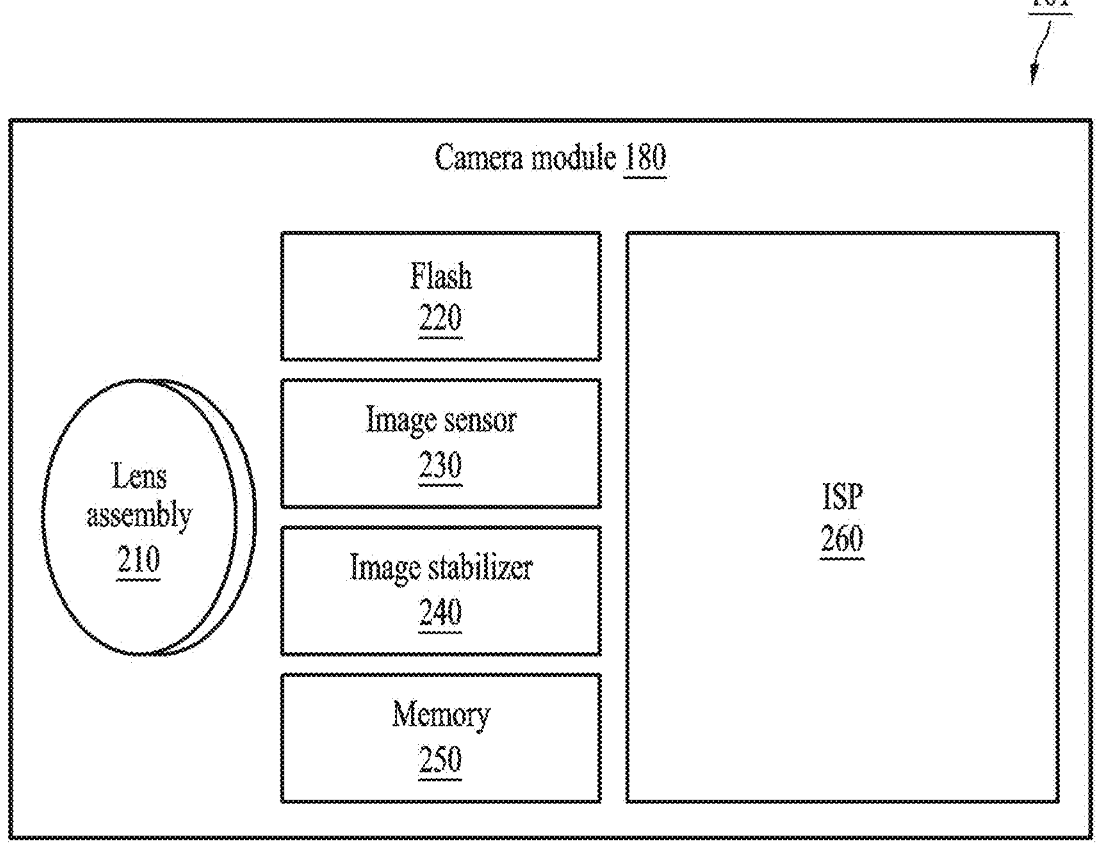
FIG. 2 is a block diagram illustrating a camera module according to an embodiment of the disclosure.

FIG. 2 is a block diagram illustrating a camera module according to an embodiment of the disclosure.

Referring to FIG. 2, the camera module 180 may include a lens assembly 210, a flash 220, an image sensor 230, an image stabilizer 240, memory 250 (e.g., buffer memory), or an ISP 260. The lens assembly 210 may collect light emitted from an object which is a target of which an image is to be captured. The lens assembly 210 may include one or more lenses. According to an embodiment of the disclosure, the camera module 180 may include a plurality of lens assemblies 210. In this case, the camera module 180 may constitute, for example, a dual camera, 360-degree camera, or spherical camera. A portion of the plurality of lens assemblies 210 may have the same lens properties (e.g., an angle of view, focal length, auto focus, f number, or optical zoom), or at least one of the plurality of lens assemblies 210 may have one or more lens properties that are different from those of other lens assemblies. The lens assembly 210 may include, for example, a wide-angle lens or telephoto lens.

The flash 220 may emit light to be used to enhance light emitted or reflected from the object. According to an embodiment of the disclosure, the flash 220 may include one or more light emitting diodes (LEDs) (e.g., a red-green-blue (RGB) LED, white LED, infrared (IR) LED, or ultraviolet (UV) LED) or a xenon lamp. The image sensor 230 may obtain an image corresponding to the object by converting light emitted or reflected from the object and transmitted through the lens assembly 210 into an electrical signal. According to an embodiment of the disclosure, the image sensor 230 may include, for example, one image sensor selected from among image sensors having different properties, such as, for example, an RGB sensor, black and white (BW) sensor, IR sensor, or UV sensor, a plurality of image sensors having the same property, or a plurality of image sensors having different properties. Each image sensor included in the image sensor 230 may be implemented using, for example, a charged coupled device (CCD) sensor or complementary metal-oxide-semiconductor (CMOS) sensor.

The image stabilizer 240 may move at least one lens included in the lens assembly 210 or the image sensor 230 in a specific direction, or control an operation characteristic (e.g., adjust the read-out timing) of the image sensor 230, in response to movement of the camera module 180 or the electronic device 101 including the camera module 180. This may compensate for at least a portion of a negative effect of the movement on an image to be captured. According to an embodiment of the disclosure, the image stabilizer 240 may detect such movement of the camera module 180 or the electronic device 101 using a gyro sensor (not shown) or acceleration sensor (not shown) disposed inside or outside the camera module 180. According to an embodiment of the disclosure, the image stabilizer 240 may be implemented as, for example, an optical image stabilizer. The memory 250 may temporarily store at least a portion of the image obtained through the image sensor 230 for a subsequent image processing operation. For example, when image acquisition is delayed by a shutter or a plurality of images is obtained at a high speed, an obtained original image (e.g., a Bayer-patterned image or high-resolution image) may be stored in the memory 250 and a copy image (e.g., a low-resolution image) corresponding the original image may be previewed through the display module 160. Subsequently, when a specified condition (e.g., a user input or system command) is satisfied, at least a portion of the original image stored in the memory 250 may be obtained and processed by, for example, the ISP 260. According to an embodiment of the disclosure, the memory 250 may be configured as at least a part of the memory 130 or as separate memory operated independently of the memory 130.

The ISP 260 may perform one or more image processing operations on an image obtained through the image sensor 230 or image stored in the memory 250. The one or more image processing operations may include, for example, depth map generation, three-dimensional (3D) modeling, panorama generation, feature point extraction, image synthesis, or image compensation (e.g., noise reduction, resolution adjustment, brightness adjustment, blurring, sharpening, or softening). Additionally or alternatively, the ISP 260 may control at least one of the components (e.g., the image sensor 230) included in the camera module 180. For example, the ISP 260 may control an exposure time, read-out timing, and the like. The image processed by the ISP 260 may be stored again in the memory 250 for further processing, or be provided to an external component (e.g., the memory 130, the display module 160, the external electronic device 102, the external electronic device 104, or the server 108) of the camera module 180. According to an embodiment of the disclosure, the ISP 260 may be configured as at least a part of the processor 120 or as a separate processor operated independently from the processor 120. When the ISP 260 is configured as a processor that is separate from the processor 120, at least one image processed by the ISP 260 may be displayed as it is without a change or be displayed through the display module 160 after additional image processing is performed by the processor 120.

According to an embodiment of the disclosure, the electronic device 101 may include a plurality of camera modules 180 having different properties or functions. In this case, for example, at least one of the plurality of camera modules 180 may be a wide-angle camera, and at least another one of the plurality of camera modules 180 may be a telephoto camera. Similarly, at least one of the plurality of camera modules 180 may be a front camera, and at least another one of the plurality of camera modules 180 may be a rear camera.

Figure 3A:
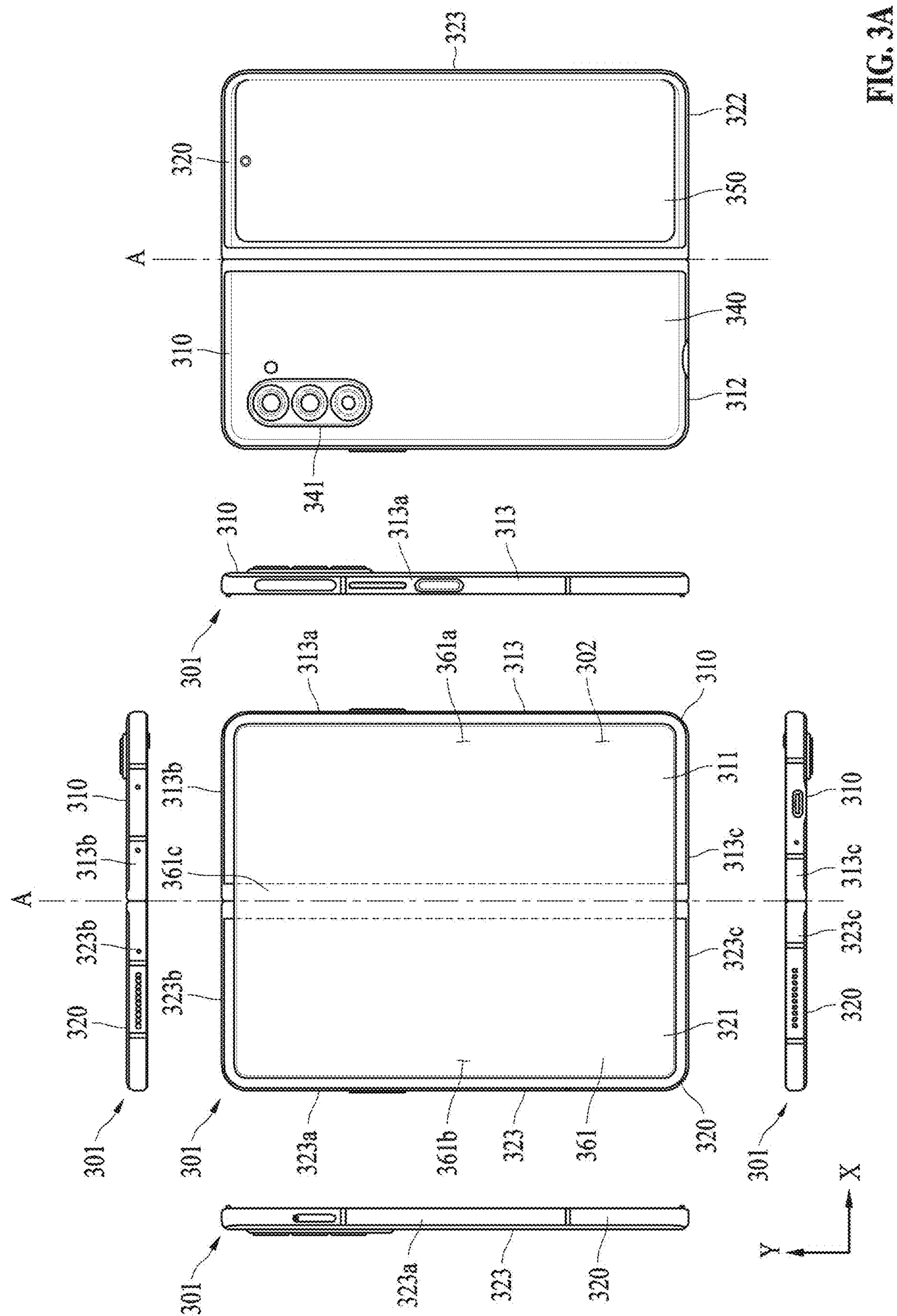
FIG. 3A is a diagram illustrating an electronic device in an unfolded state according to an embodiment of the disclosure.

FIG. 3A is a diagram illustrating an electronic device in an unfolded state according to an embodiment of the disclosure.

Figure 3B:
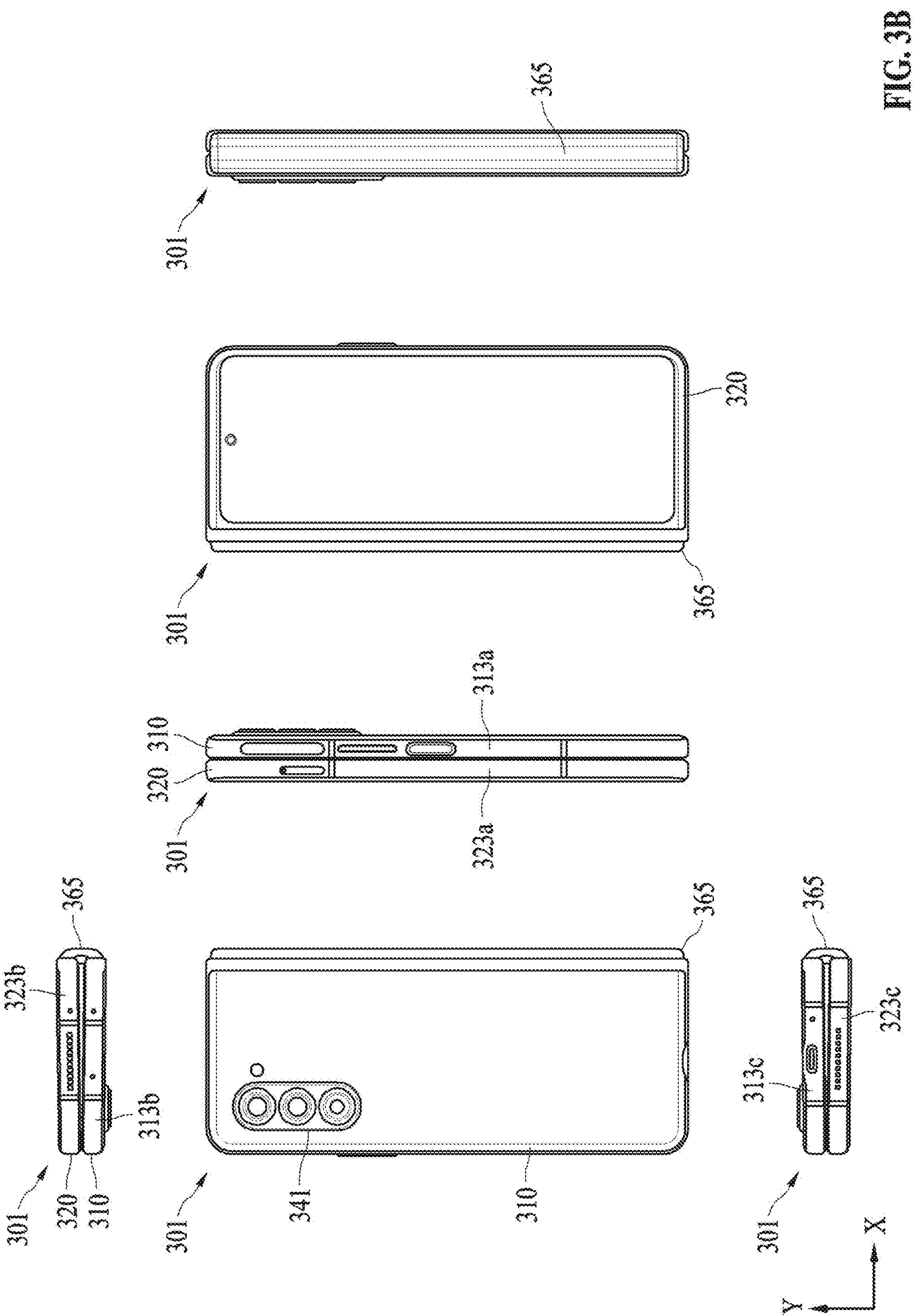
FIG. 3B is a diagram illustrating an electronic device in a folded state according to an embodiment of the disclosure.

FIG. 3B is a diagram illustrating the electronic device in a folded state according to an embodiment of the disclosure.

Figure 4:
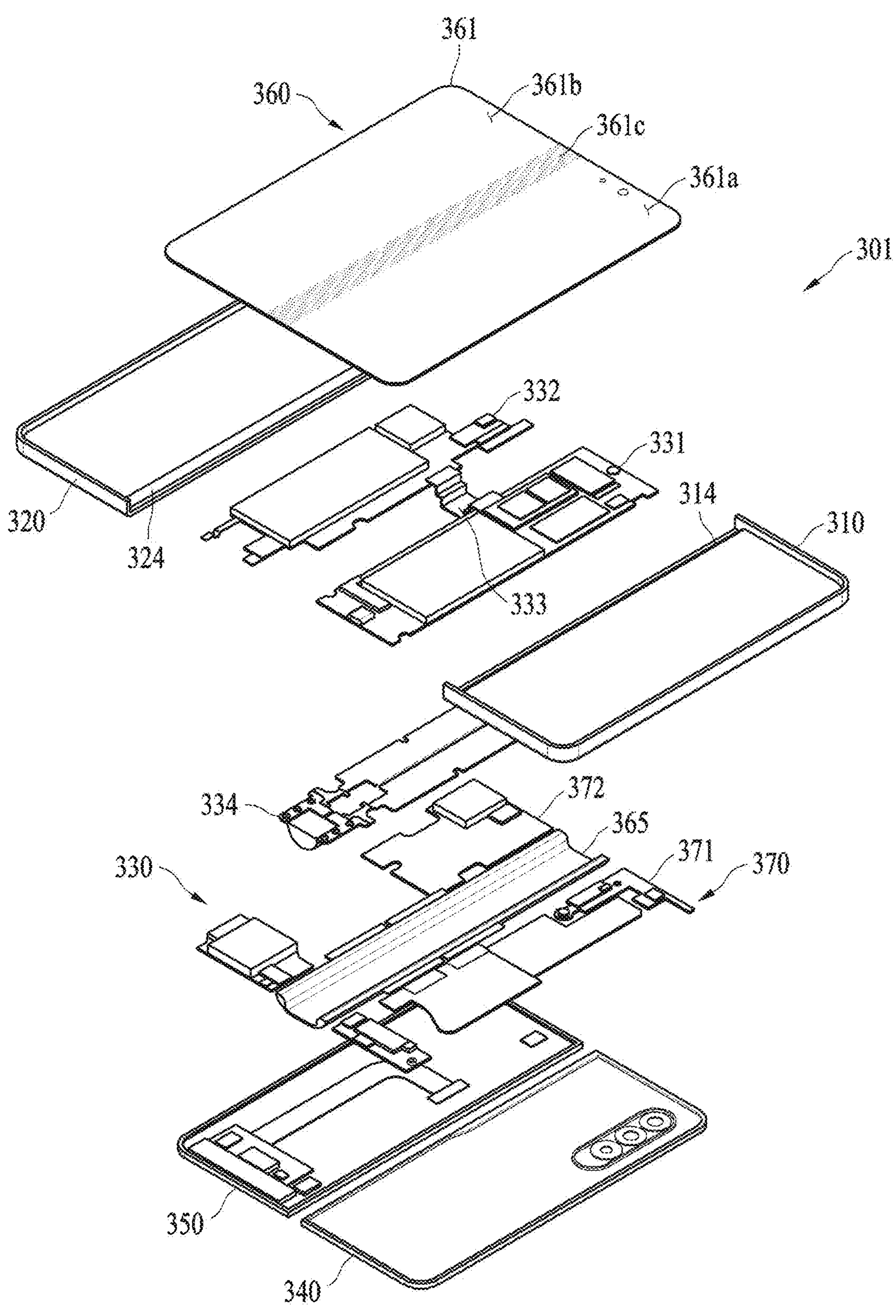
FIG. 4 is an exploded perspective view illustrating an electronic device according to an embodiment of the disclosure.

FIG. 4 is an exploded perspective view illustrating the electronic device according to an embodiment of the disclosure.

Referring to FIGS. 3A, 3B, and 4, a foldable electronic device 301 may include the first housing 310 and the second housing 320 rotatably coupled to each other through a hinge structure (e.g., a hinge structure 334 of FIG. 4) to be folded with respect to each other, a hinge cover 365 that covers foldable portions of the first housing 310 and the second housing 320, and a display 361 (e.g., a flexible display or foldable display) disposed in a space formed by the first housing 310 and the second housing 320. In the disclosure, a surface on which the display 361 is disposed may be defined as a front surface of the foldable electronic device 301, and a surface that is opposite to the front surface of the foldable electronic device 301 may be defined as a rear surface of the foldable electronic device 301. In addition, a surface enclosing a space between the front surface and the rear surface of the foldable electronic device 301 may be defined as a side surface of the foldable electronic device 301.

In an embodiment of the disclosure, the first housing 310 and the second housing 320 may include a first housing 310, a second housing 320, a first rear cover 340, and a second rear cover 350. The first housing 310 and the second housing 320 of the foldable electronic device 301 are not limited to the shape or combination and/or coupling of components shown in FIGS. 3A and 3B and may be implemented in other shapes or by another combination and/or coupling of components.

In an embodiment of the disclosure, the first housing 310 and the second housing 320 may be disposed on both sides with respect to a folding axis A and may be disposed substantially symmetrical with respect to the folding axis A. In an embodiment of the disclosure, an angle or distance between the first housing 310 and the second housing 320 may vary depending on whether the foldable electronic device 301 is in an unfolded state, folded state, or intermediate state. In an embodiment of the disclosure, the first housing 310 and the second housing 320 may have substantially symmetrical shapes.

In an embodiment of the disclosure, the first housing 310 may be connected to the hinge structure (e.g., the hinge structure 334 of FIG. 4) in the unfolded state of the foldable electronic device 301. The first housing 310 may include a first surface 311 facing the front surface of the foldable electronic device 301, a second surface 312 facing a direction that is opposite to the first surface 311, and a first side portion 313 enclosing at least a portion of a space between the first surface 311 and the second surface 312. The first side portion 313 may include a first side surface **313*a* disposed substantially in parallel with the folding axis A, a second side surface 313*b* extending in a direction substantially perpendicular to the folding axis A from one end portion of the first side surface 313*a*, and a third side surface 313*c* extending in a direction substantially perpendicular to the folding axis A from the other end portion of the first side surface 313*a* and substantially parallel to the second side surface 313*b*. The second housing 320 may be connected to the hinge structure (e.g., the hinge structure 334 of FIG. 4) in the unfolded state of the foldable electronic device 301. The second housing 320 may include a third surface 321 facing the front surface of the foldable electronic device 301, a fourth surface 322 facing a direction that is opposite to the third surface 321, and a second side portion 323 enclosing at least a portion of a space between the third surface 321 and the fourth surface 322. The second side portion 323 may include a fourth side surface 323***a* disposed substantially in parallel with the folding axis A, a fifth side surface 323*b* extending in a direction substantially perpendicular to the folding axis A from one end portion of the fourth side surface 323*a*, and a sixth side surface 323*c* extending in a direction substantially perpendicular to the folding axis A from another end portion of the fourth side surface 323*a* and substantially parallel to the fifth side surface 323*b*. The first surface 311 and the third surface 321 may face each other when the foldable electronic device 301 is in the folded state.

In an embodiment of the disclosure, the foldable electronic device 301 may include at least one sound output module (e.g., the sound output module 155 of FIG. 1) disposed on the fifth side surface 323*b* and/or the sixth side surface 323*c* of the second housing 320.

In an embodiment of the disclosure, the foldable electronic device 301 may include an accommodating portion 302 in a recessed shape that accommodates the display 361 through the structural coupling of the first housing 310 and the second housing 320. The accommodating portion 302 may have substantially the same size as the display 361.

In an embodiment of the disclosure, at least a portion of the first housing 310 and the second housing 320 may be formed of a metal material or non-metal material having a predetermined magnitude of rigidity that is appropriate to support the display 361.

In an embodiment of the disclosure, the foldable electronic device 301 may include at least one component disposed to be exposed on the front surface of the foldable electronic device 301 to perform various functions. For example, the at least one component may include at least one of a front camera module, receiver, proximity sensor, illuminance sensor, iris recognition sensor, ultrasonic sensor, or indicator.

In an embodiment of the disclosure, the first rear cover 340 may be disposed on the second surface 312 of the first housing 310 and may have substantially rectangular peripheries. At least a portion of the peripheries of the first rear cover 340 may be enclosed by the first housing 310. The second rear cover 350 may be disposed on the fourth surface 322 of the second housing 320 and may have substantially rectangular peripheries. At least a portion of the peripheries of the second rear cover 350 may be enclosed by the second housing 320.

In an embodiment of the disclosure, the first rear cover 340 and the second rear cover 350 may have substantially symmetrical shapes with respect to the folding axis A. In an embodiment of the disclosure, the first rear cover 340 and the second rear cover 350 may have different shapes. In an embodiment of the disclosure, the first housing 310 and the first rear cover 340 may be integrally formed, and the second housing 320 and the second rear cover 350 may be integrally formed.

In an embodiment of the disclosure, the first housing 310, the second housing 320, the first rear cover 340, and the second rear cover 350 may provide a space in which various components (e.g., a PCB, the antenna module 197 of FIG. 1, the sensor module 176 of FIG. 1, or the battery 189 of FIG. 1) of the foldable electronic device 301 may be disposed through a structure in which the first housing 310, the second housing 320, the first rear cover 340, and the second rear cover 350 are coupled to each other. In an embodiment of the disclosure, at least one component may be visually exposed on the rear surface of the foldable electronic device 301. For example, at least one component may be visually exposed through a first rear area 341 of the first rear cover 340. Here, the at least one component may include a proximity sensor, rear camera module, and/or flash.

In an embodiment of the disclosure, the display 361 may be disposed in the accommodating portion 302 formed by the first housing 310 and the second housing 320. For example, the display 361 may be disposed to occupy substantially most of the front surface of the foldable electronic device 301. The front surface of the foldable electronic device 301 may include an area on which the display 361 is disposed, and a partial area (e.g., a periphery area) of the first housing 310 and a partial area (e.g., a periphery area) of the second housing 320, which are adjacent to the display 361. The rear surface of the foldable electronic device 301 may include the first rear cover 340, a partial area (e.g., a periphery area) of the first housing 310 that is adjacent to the first rear cover 340, the second rear cover 350, and a partial area (e.g., a periphery area) of the second housing 320 that is adjacent to the second rear cover 350. In an embodiment of the disclosure, the display 361 may be a display in which at least one area is deformable into a planar surface or curved surface. In an embodiment of the disclosure, the display 361 may include a flexible area 361*c*, a first area 361*a* on a first side (e.g., the right side) of the flexible area 361*c*, and a second area 361*b* on a second side (e.g., the left side) of the flexible area 361*c*. The first area 361*a* may be positioned on the first surface 311 of the first housing 310, and the second area 361*b* may be positioned on the third surface 321 of the second housing 320. However, the area division of the display 361 is only an example, and the display 361 may be divided into a plurality of areas depending on the structure or function of the display 361. For example, as shown in FIG. 3A, the display 361 may be divided into areas based on the folding axis A or the flexible area 361*c* extending in parallel to a Y-axis, or the display 361 may be divided into areas based on another flexible area (e.g., a flexible area extending in parallel to an X-axis) or another folding axis (e.g., a folding axis parallel to the X-axis). The area division of the display 361 as above is simply a physical division based on the first housing 310 and the second housing 320 and the hinge structure (e.g., the hinge structure 334 of FIG. 4), and the display 361 may display substantially one screen through the first housing 310 and the second housing 320 and the hinge structure (e.g., the hinge structure 334 of FIG. 4). In an embodiment of the disclosure, the first area 361*a* and the second area 361*b* may have substantially symmetrical shapes with respect to the flexible area 361*c*.

In an embodiment of the disclosure, the hinge cover 365 may be disposed between the first housing 310 and the second housing 320 and may be configured to cover the hinge structure (e.g., the hinge structure 334 of FIG. 4). The hinge cover 365 may be hidden by at least a portion of the first housing 310 and the second housing 320 or exposed to the outside according to the operational state of the foldable electronic device 301. For example, when the foldable electronic device 301 is in the unfolded state as shown in FIG. 3A, the hinge cover 365 may be hidden by the first housing 310 and the second housing 320 and not exposed to the outside, and when the foldable electronic device 301 is in the folded state as shown in FIG. 3B, the hinge cover 365 may be exposed to the outside between the first housing 310 and the second housing 320. Moreover, when the foldable electronic device 301 is in the intermediate state in which the first housing 310 and the second housing 320 form an angle with each other, at least a portion of the hinge cover 365 may be exposed to the outside between the first housing 310 and the second housing 320. In this case, an area of the hinge cover 365 exposed to the outside may be less than the area of the hinge cover 365 exposed when the foldable electronic device 301 is in the folded state. In an embodiment of the disclosure, the hinge cover 365 may have a curved surface.

Describing the operation of the foldable electronic device 301, when the foldable electronic device 301 is in the unfolded state (e.g., the state of the foldable electronic device 301 of FIG. 3A), the first housing 310 and the second housing 320 may form a first angle (e.g., about 180 degrees) with each other, and the first area 361*a* and the second area 361*b* of the display 361 may be oriented in substantially the same direction. The flexible area 361*c* of the display 361 may be on substantially the same plane as the first area 361*a* and the second area 361*b*. In an embodiment of the disclosure, when the foldable electronic device 301 is in the unfolded state, the first housing 310 may rotate at a second angle (e.g., about 360 degrees) relative to the second housing 320, whereby the first housing 310 and the second housing 320 may be reversely folded such that the second surface 312 and the fourth surface 322 may face each other. Moreover, when the foldable electronic device 301 is in the folded state (e.g., the state of the foldable electronic device 301 of FIG. 3B), the first housing 310 and the second housing 320 may face each other. The first housing 310 and the second housing 320 may form an angle of about 0 degrees to about 10 degrees, and the first area 361*a* and the second area 361*b* of the display 361 may face each other. At least a portion of the flexible area 361*c* of the display 361 may be deformed into a curved surface. Moreover, when the foldable electronic device 301 is in the intermediate state, the first housing 310 and the second housing 320 may form a predetermined angle with each other. An angle (e.g., a third angle, about 90 degrees) formed by the first area 361*a* and the second area 361*b* of the display 361 may be greater than that when the foldable electronic device 301 is in the folded state and may be less than that when the foldable electronic device 301 is in the unfolded state. At least a portion of the flexible area 361*c* of the display 361 may be deformed into a curved surface. In this case, a curvature of the curved surface of the flexible area 361*c* may be less than that when the foldable electronic device 301 is in the folded state.

Moreover, various embodiments of an electronic device described herein are not limited to a form factor of the foldable electronic device 301 described with reference to FIGS. 3A and 3B and may also apply to an electronic device with various form factors.

Referring to FIG. 4, the foldable electronic device 301 may include a display module 360 (e.g., the display module 160 of FIG. 1), a hinge assembly 330, a substrate 370, the first housing 310 (e.g., the first housing 310 of FIGS. 3A and 3B), the second housing 320 (e.g., the second housing 320 of FIGS. 3A and 3B), the first rear cover 340 (e.g., the first rear cover 340 of FIGS. 3A and 3B), and the second rear cover 350 (e.g., the second rear cover 350 of FIGS. 3A and 3B).

The display module 360 may include the display 361 (e.g., the display 361 of FIGS. 3A and 3B) and at least one layer or a plate on which the display 361 seats. In an embodiment of the disclosure, the plate may be disposed between the display 361 and the hinge assembly 330. The display 361 may be disposed on at least a portion of one surface (e.g., a top surface) of the plate. The plate may be formed in a shape corresponding to the display 361.

The hinge assembly 330 may include a first bracket 331, a second bracket 332, the hinge structure 334 disposed between the first bracket 331 and the second bracket 332, the hinge cover 365 that covers the hinge structure 334 when the hinge structure 334 is viewed from the outside, and a PCB 333 that traverses the first bracket 331 and the second bracket 332. In an embodiment of the disclosure, the PCB 333 may be a flexible printed circuit board (FPCB).

In an embodiment of the disclosure, the hinge assembly 330 may be disposed between the plate and the substrate 370. For example, the first bracket 331 may be disposed between the first area 361*a* of the display 361 and a first substrate 371. The second bracket 332 may be disposed between the second area 361*b* of the display 361 and a second substrate 372.

In an embodiment of the disclosure, at least a portion of the hinge structure 334 and the PCB 333 may be disposed inside the hinge assembly 330. The PCB 333 may be disposed in a direction (e.g., the X-axis direction) that traverses the first bracket 331 and the second bracket 332. The PCB 333 may be disposed in a direction (e.g., the X-axis direction) perpendicular to a folding axis (e.g., the Y-axis or the folding axis A of FIG. 3A) of the flexible area 361*c* of the foldable electronic device 301.

The substrate 370 may include the first substrate 371 disposed on the first bracket 331 and the second substrate 372 disposed on the second bracket 332. The first substrate 371 and the second substrate 372 may be disposed in a space formed by the hinge assembly 330, the first housing 310, the second housing 320, the first rear cover 340, and the second rear cover 350. Components for implementing various functions of the foldable electronic device 301 may be mounted on the first substrate 371 and the second substrate 372.

The first housing 310 and the second housing 320 may be assembled together to be coupled to both sides of the hinge assembly 330 in a state in which the display module 360 is coupled to the hinge assembly 330. The first housing 310 and the second housing 320 may be coupled to the hinge assembly 330 by sliding from both sides of the hinge assembly 330.

In an embodiment of the disclosure, the first housing 310 may include a first rotation support surface 314, and the second housing 320 may include a second rotation support surface 324 corresponding to the first rotation support surface 314. The first rotation support surface 314 and the second rotation support surface 324 may include curved surfaces corresponding to the curved surface included in the hinge cover 365.

In an embodiment of the disclosure, when the foldable electronic device 301 is in the unfolded state (e.g., the foldable electronic device 301 of FIG. 3A), the first rotation support surface 314 and the second rotation support surface 324 may cover the hinge cover 365 such that the hinge cover 365 may not be exposed through the rear surface of the foldable electronic device 301 or may be minimally exposed. Moreover, when the foldable electronic device 301 is in the folded state (e.g., the foldable electronic device 301 of FIG. 3B), the first rotation support surface 314 and the second rotation support surface 324 may rotate along the curved surface included in the hinge cover 365 such that the hinge cover 365 may be maximally exposed through the rear surface of the foldable electronic device 301.

Figure 5:
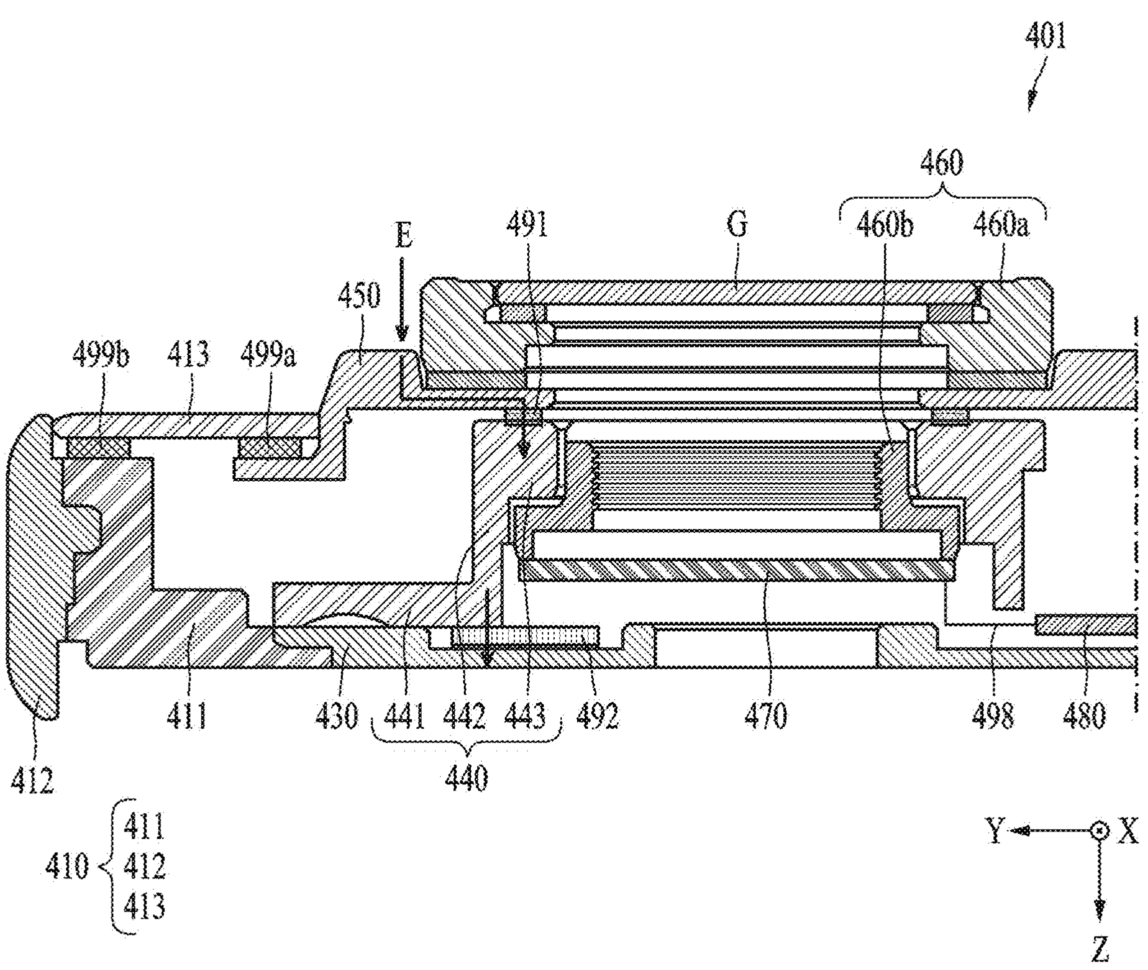
FIG. 5 is a cross-sectional view illustrating an electronic device according to an embodiment of the disclosure.
Figure 6:
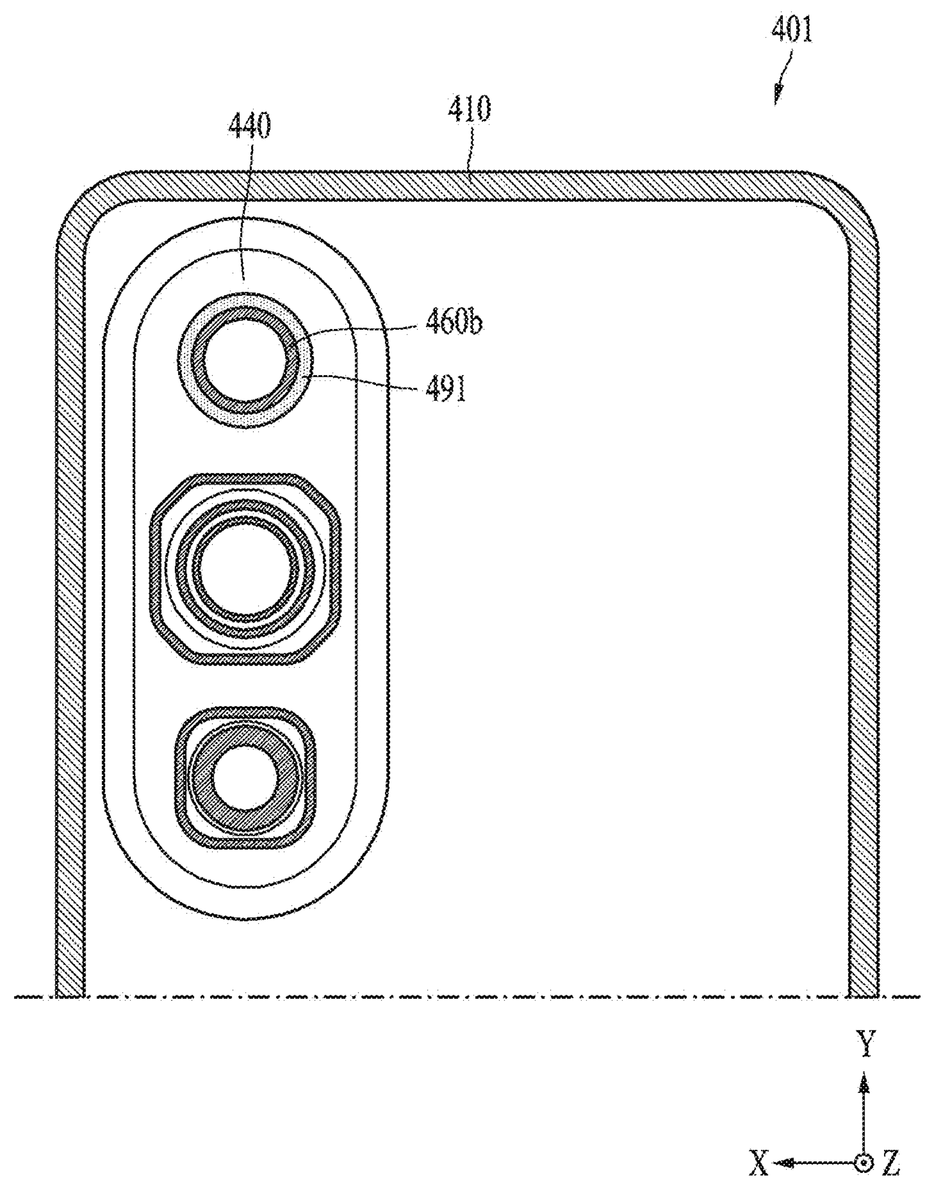
FIG. 6 is a plan view schematically illustrating a camera flange, lens structure, and conductive connector of an electronic device according to an embodiment of the disclosure.

FIG. 5 is a cross-sectional view illustrating an electronic device according to an embodiment of the disclosure, and FIG. 6 is a plan view schematically illustrating a camera flange, lens structure, and conductive connector of the electronic device, according to an embodiment of the disclosure.

Referring to FIGS. 5 and 6, in an embodiment of the disclosure, an electronic device 401 (e.g., the electronic device 101 of FIG. 1) may include a housing 410, a base plate 430, a camera flange 440, a cover frame 450, a plurality of lens structures 460*a* and 460*b*, an image sensor 470, a PCB 480, a first conductive connector 491, a second conductive connector 492, and a plurality of adhesive members 499*a* and 499*b*.

In an embodiment of the disclosure, the housing 410 may have a hollow therein. The housing 410 may include a main body 411, a side frame 412, and a cover plate 413.

In an embodiment of the disclosure, the main body 411 may support a plurality of components therein. For example, the main body 411 may support at least one of a processor (e.g., the processor 120 of FIG. 1), memory (e.g., the memory 130 of FIG. 1), an input module (e.g., the input module 150 of FIG. 1), a sound output module (e.g., the sound output module 155 of FIG. 1), a display module (e.g., the display module 160 of FIG. 1), an audio module (e.g., the audio module 170 of FIG. 1), a sensor module (e.g., the sensor module 176 of FIG. 1), an interface (e.g., the interface 177 of FIG. 1), a connecting terminal (e.g., the connecting terminal 178 of FIG. 1), a haptic module (e.g., the haptic module 179 of FIG. 1), a camera module (e.g., the camera module 180 of FIG. 1), a power management module (e.g., the power management module 188 of FIG. 1), a battery (e.g., the battery 189 of FIG. 1), a communication module (e.g., the communication module 190 of FIG. 1), a SIM (e.g., the SIM 196 of FIG. 1), or an antenna module (e.g., the antenna module 197 of FIG. 1).

In an embodiment of the disclosure, the side frame 412 may be connected to the main body 411. For example, the side frame 412 may enclose the main body 411. For example, the side frame 412 may be disposed on a side surface in the +y direction, side surface in the −y direction, side surface in the +x direction, and/or side surface in the −x direction of the main body 411. It should be noted that the side frame 412 is described as a separate component from the main body 411 but is not limited thereto. For example, the side frame 412 may be integrally formed with the main body 411. The side frame 412 may have, for example, a ring shape.

In an embodiment of the disclosure, the cover plate 413 may be connected to the main body 411. For example, the cover plate 413 may cover the hollow in the housing 410.

In an embodiment of the disclosure, the base plate 430 may be disposed on the main body 411. The base plate 430 may include a metal material. The base plate 430 may have a flat plate shape.

In an embodiment of the disclosure, the camera flange 440 may be disposed on the base plate 430. The camera flange 440 may protect a lens structure. The camera flange 440 may include a metal material. The camera flange 440 may include a flange base 441, a flange body 442, and a flange head 443. The flange base 441 may be connected to the base plate 430. The flange body 442 may extend from the flange base 441. For example, the flange body 442 may extend in the z-axis direction. The flange head 443 may protrude from an inner wall of the flange body 442. The flange head 443 may be provided with a structure in which the lens structure is caught.

In an embodiment of the disclosure, the cover frame 450 may cover the camera flange 440. The cover frame 450 may protect the camera flange 440. The cover frame 450 may overlap the camera flange 440 in the z-axis direction. An edge portion of the cover frame 450 may overlap the cover plate 413 in the z-axis direction. The cover frame 450 and the camera flange 440 may be connected to each other by the first conductive connector 491. The edge portion of the cover frame 450 and the cover plate 413 may be connected to each other by a first adhesive member 499*a*. A portion of the cover frame 450 may be provided inside the housing 410, and a portion of the cover frame 450 may protrude to outside the housing 410.

In an embodiment of the disclosure, the plurality of lens structures 460*a* and 460*b* may include an outer lens structure 460*a* and an inner lens structure 460*b*. The plurality of lens structures 460*a* and 460*b* may include a lens and lens case to support the lens. The outer lens structure 460*a* and the inner lens structure 460*b* may be stacked in the z-axis direction. The outer lens structure 460*a* may include a glass G to prevent or reduce the inflow of moisture and/or foreign materials from outside. Each of the plurality of lens structures 460*a* and 460*b* may have an optical axis. The plurality of lens structures 460*a* and 460*b* may be aligned in the optical axis. For example, the optical axis may be parallel to the z-axis.

In an embodiment of the disclosure, the image sensor 470 may be connected to the inner lens structure 460*b*. The image sensor 470 may convert light incident through the plurality of lens structures 460*a* and 460*b* into an electrical signal. The image sensor 470 may be electrically connected to the PCB 480. The image sensor 470 may be positioned to be substantially aligned with the optical axis of the plurality of lens structures 460*a* and 460*b*.

In an embodiment of the disclosure, the PCB 480 may include various circuit elements for driving the camera module. For example, the PCB 480 may be electrically connected to the image sensor 470. The electronic device 401 may further include a connecting path 498 for electrically connecting the PCB 480 to the image sensor 470. For example, the connecting path 498 may be a path through which a signal is transmitted to the electronic device 401 and/or a path through which power is transmitted to the electronic device 401. the connecting path 498 may be formed. However, the connecting path 498 shown in the diagram is only an example, and the number, location, and/or shape of the connecting path 498 is not limited thereto.

In an embodiment of the disclosure, the first conductive connector 491 may be disposed between the cover frame 450 and the camera flange 440. The first conductive connector 491 may be provided in a state compressed by the cover frame 450 and the camera flange 440. The first conductive connector 491 may electrically connect the cover frame 450 to the camera flange 440.

In an embodiment of the disclosure, the first conductive connector 491 may block moisture and/or foreign materials from flowing into a space between the cover frame 450 and the camera flange 440. The first conductive connector 491 may electrically connect the cover frame 450 to the camera flange 440 while blocking the inflow of moisture and/or foreign materials.

In an embodiment of the disclosure, the first conductive connector 491 may implement a discharge pass E extending from the cover frame 450 to the base plate 430. Specifically, the discharge pass E may include the cover frame 450, the first conductive connector 491, the camera flange 440, the second conductive connector 492, and the base plate 430. For example, the second conductive connector 492 may be omitted from the discharge pass E. For example, the discharge pass E may include the cover frame 450, the first conductive connector 491, the camera flange 440, and the base plate 430. According to this structure, while an electrostatic discharge occurs, the discharge pass E does not pass through the PCB 480 so that the effect of the electrostatic discharge acting on the wiring provided on the PCB 480 may be reduced or eliminated. The stability of the wiring provided on the PCB 480 may be improved.

In an embodiment of the disclosure, the first conductive connector 491 may have elasticity. One end of the first conductive connector 491 may be supported by the camera flange 440 and the other end of the first conductive connector 491 may be supported by the cover frame 450.

In an embodiment of the disclosure, the first conductive connector 491 may include a conductive sponge. The first conductive connector 491 may include a metal material. The first conductive connector 491 may include a sponge or foam. The first conductive connector 491 may allow air to pass through but may block most of the movement of moisture and/or foreign materials. The first conductive connector 491 may close a space between the base plate 430 and the camera flange 440.

In an embodiment of the disclosure, the first conductive connector 491 may enclose at least a portion of the inner lens structure 460*b*. For example, the first conductive connector 491 may have a ring shape. The first conductive connector 491 may be provided in the form that surrounds the optical axis.

In an embodiment of the disclosure, the second conductive connector 492 may be disposed between the base plate 430 and the camera flange 440. The second conductive connector 492 may be attached to each of the base plate 430 and the camera flange 440.

In an embodiment of the disclosure, the plurality of adhesive members 499*a* and 499*b* may include the first adhesive member 499*a* and a second adhesive member 499*b*. The first adhesive member 499*a* may connect the cover plate 413 to the cover frame 450. The second adhesive member 499*b* may connect the cover plate 413 to the main body 411.

Figure 7:
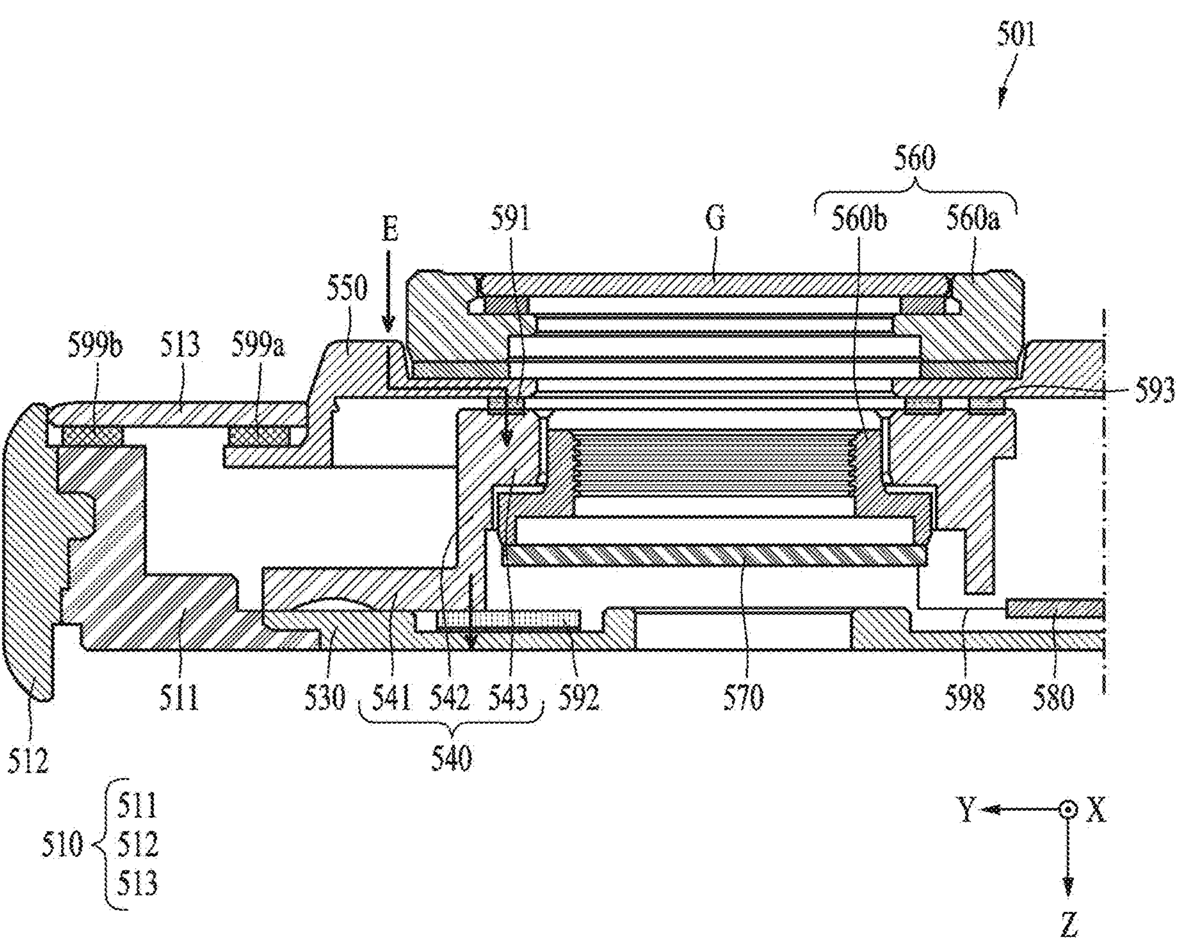
FIG. 7 is a cross-sectional view illustrating an electronic device according to an embodiment of the disclosure.
Figure 8:
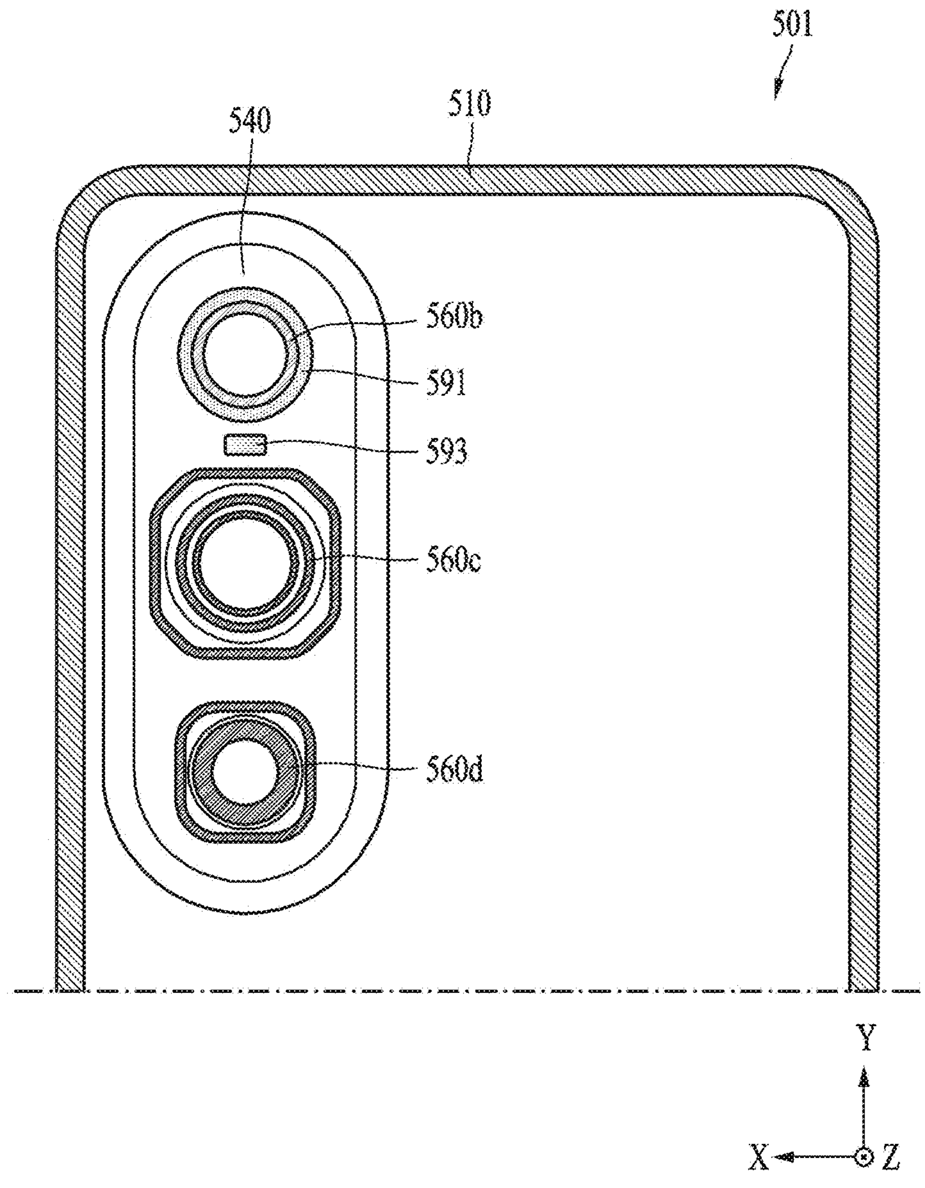
FIG. 8 is a plan view schematically illustrating a camera flange, lens structure, and conductive connector of an electronic device according to an embodiment of the disclosure.

FIG. 7 is a cross-sectional view illustrating an electronic device according to an embodiment of the disclosure, and FIG. 8 is a plan view schematically illustrating a camera flange, lens structure, and conductive connector of the electronic device, according to an embodiment of the disclosure.

Referring to FIGS. 7 and 8, in an embodiment of the disclosure, an electronic device 501 (e.g., the electronic device 101 of FIG. 1) may include a housing 510, a base plate 530, a camera flange 540, a cover frame 550, a plurality of lens structures 560*a*, 560*b*, 560*c*, and 560*d*, an image sensor 570, a PCB 580, a 1-1 conductive connector 591, a second conductive connector 592, and a plurality of adhesive members 599*a* and 599*b*.

In an embodiment of the disclosure, the housing 510 may have a hollow therein. The housing 510 may include a main body 511, a side frame 512, and a cover plate 513.

In an embodiment of the disclosure, the main body 511 may support a plurality of components therein. For example, the main body 511 may support at least one of a processor (e.g., the processor 120 of FIG. 1), memory (e.g., the memory 130 of FIG. 1), an input module (e.g., the input module 150 of FIG. 1), a sound output module (e.g., the sound output module 155 of FIG. 1), a display module (e.g., the display module 160 of FIG. 1), an audio module (e.g., the audio module 170 of FIG. 1), a sensor module (e.g., the sensor module 176 of FIG. 1), an interface (e.g., the interface 177 of FIG. 1), a connecting terminal (e.g., the connecting terminal 178 of FIG. 1), a haptic module (e.g., the haptic module 179 of FIG. 1), a camera module (e.g., the camera module 180 of FIG. 1), a power management module (e.g., the power management module 188 of FIG. 1), a battery (e.g., the battery 189 of FIG. 1), a communication module (e.g., the communication module 190 of FIG. 1), a SIM (e.g., the SIM 196 of FIG. 1), or an antenna module (e.g., the antenna module 197 of FIG. 1).

In an embodiment of the disclosure, the side frame 512 may be connected to the main body 511. For example, the side frame 512 may enclose the main body 511. For example, the side frame 512 may be disposed on a side surface in the +y direction, side surface in the −y direction, side surface in the +x direction, and/or side surface in the −x direction of the main body 511. It should be noted that the side frame 512 is described as a separate component from the main body 511 but is not limited thereto. For example, the side frame 512 may be integrally formed with the main body 511. The side frame 512 may have, for example, a ring shape.

In an embodiment of the disclosure, the cover plate 513 may be connected to the main body 511. For example, the cover plate 513 may cover the hollow in the housing 510.

In an embodiment of the disclosure, the base plate 530 may be disposed on the main body 511. The base plate 530 may include a metal material. The base plate 530 may have a flat plate shape.

In an embodiment of the disclosure, the camera flange 540 may be disposed on the base plate 530. The camera flange 540 may protect a lens structure. The camera flange 540 may include a metal material. The camera flange 540 may include a flange base 541, a flange body 542, and a flange head 543. The flange base 541 may be connected to the base plate 530. The flange body 542 may extend from the flange base 541. For example, the flange body 542 may extend in the z-axis direction. The flange head 543 may protrude from an inner wall of the flange body 542. The flange head 543 may be provided with a structure in which the lens structure is caught.

In an embodiment of the disclosure, the cover frame 550 may cover the camera flange 540. The cover frame 550 may protect the camera flange 540. The cover frame 550 may overlap the camera flange 540 in the z-axis direction. An edge portion of the cover frame 550 may overlap the cover plate 513 in the z-axis direction. The cover frame 550 and the camera flange 540 may be connected to each other by the 1-1 conductive connector 591. The edge portion of the cover frame 550 and the cover plate 513 may be connected to each other by a first adhesive member 599*a*. A portion of the cover frame 550 may be provided inside the housing 510, and a portion of the cover frame 550 may protrude to outside the housing 510.

In an embodiment of the disclosure, the plurality of lens structures 560*a*, 560*b*, 560*c*, and 560*d* may include an outer lens structure 560*a* and a plurality of inner lens structures 560*b*, 560*c*, and 560*d*. It should be noted that the outer lens structure 560*a* may also be provided in plurality. The outer lens structure 560*a* and the inner lens structure 560*b* may be stacked in the z-axis direction. The outer lens structure 560*a* may include a glass G to prevent or reduce the inflow of moisture and/or foreign materials from outside. Each of the plurality of lens structures 560*a* and 560*b* may have an optical axis. The plurality of lens structures 560*a* and 560*b* may be aligned in the optical axis. For example, the optical axis may be parallel to the z-axis.

In an embodiment of the disclosure, the plurality of inner lens structures 560*b*, 560*c*, and 560*d* may be spaced apart from each other in the y-axis direction. A connector may be provided around each of the plurality of inner lens structures 560*b*, 560*c*, and 560*d* to prevent the inflow of foreign materials. The connector may be, for example, a sponge.

In an embodiment of the disclosure, the image sensor 570 may be connected to the inner lens structure 560*b*. The image sensor 570 may convert light incident through the plurality of lens structures 560*a* and 560*b* into an electrical signal. The image sensor 570 may be electrically connected to the PCB 580. The image sensor 570 may be positioned to be substantially aligned with the optical axis of the plurality of lens structures 560*a* and 560*b*.

In an embodiment of the disclosure, the PCB 580 may include various circuit elements for driving the camera module. For example, the PCB 580 may be electrically connected to the image sensor 570. The electronic device 501 may further include a connecting path 598 for electrically connecting the PCB 580 to the image sensor 570. For example, the connecting path 598 may be a path through which a signal is transmitted to the electronic device 501 and/or a path through which power is transmitted to the electronic device 501. At least one connecting path 598 may be formed. However, the connecting path 598 shown in the diagram is only an example, and the number, location, and/or shape of the connecting path 598 are not limited thereto.

In an embodiment of the disclosure, first conductive connectors 591 and 593 may be provided in plurality. The plurality of first conductive connectors 591 and 593 may include the 1-1 conductive connector 591 and a 1-2 conductive connector 593. The 1-1 conductive connector 591 and the 1-2 conductive connector 593 may be provided at positions spaced apart from each other in a direction perpendicular to the optical axis.

In an embodiment of the disclosure, the 1-1 conductive connector 591 may be disposed between the cover frame 550 and the camera flange 540. The 1-1 conductive connector 591 may be provided in a state compressed by the cover frame 550 and the camera flange 540. The 1-1 conductive connector 591 may electrically connect the cover frame 550 to the camera flange 540.

In an embodiment of the disclosure, the 1-1 conductive connector 591 may block moisture and/or foreign materials from flowing into a space between the cover frame 550 and the camera flange 540. The 1-1 conductive connector 591 may electrically connect the cover frame 550 to the camera flange 540 while blocking the inflow of moisture and/or foreign materials.

In an embodiment of the disclosure, the 1-1 conductive connector 591 may implement a discharge pass E extending from the cover frame 550 to the base plate 530. Specifically, the discharge pass E may include the cover frame 550, the 1-1 conductive connector 591, the camera flange 540, the second conductive connector 592, and the base plate 530. For example, the second conductive connector 592 may be omitted from the discharge pass E. For example, the discharge pass E may include the cover frame 550, the 1-1 conductive connector 591, the camera flange 540, and the base plate 530. According to this structure, while an electrostatic discharge occurs, the discharge pass E does not pass through the PCB 580 so that the effect of the electrostatic discharge acting on the wiring provided on the PCB 580 may be reduced or eliminated. The stability of the wiring provided on the PCB 580 may be improved.

In an embodiment of the disclosure, the 1-1 conductive connector 591 may have elasticity. One end of the 1-1 conductive connector 591 may be supported by the camera flange 540 and the other end of the 1-1 conductive connector 591 may be supported by the cover frame 550.

In an embodiment of the disclosure, the 1-1 conductive connector 591 may include a conductive sponge. The 1-1 conductive connector 591 may include a metal material. The 1-1 conductive connector 591 may allow air to pass through but may block most of the movement of moisture and/or foreign materials. The 1-1 conductive connector 591 may close a space between the base plate 530 and the camera flange 540.

In an embodiment of the disclosure, the 1-1 conductive connector 591 may enclose at least a portion of the inner lens structure 560*b*. For example, the 1-1 conductive connector 591 may have a ring shape. The 1-1 conductive connector 591 may be provided in the form that surrounds the optical axis.

In an embodiment of the disclosure, the 1-2 conductive connector 593 may be disposed between the cover frame 550 and the camera flange 540. The 1-2 conductive connectors 593 may be provided in a state compressed between the cover frame 550 and the camera flange 540. The 1-2 conductive connectors 593 may have a columnar shape. For example, the 1-2 conductive connectors 593 may have a cylindrical shape or rectangular column shape. It should be noted that the shape of the 1-2 conductive connectors 593 is not limited thereto.

In an embodiment of the disclosure, the 1-2 conductive connector 593 may implement the discharge pass E extending from the cover frame 550 to the base plate 530. Specifically, the discharge pass E may include the cover frame 550, the 1-2 conductive connector 593, the camera flange 540, the second conductive connector 592, and the base plate 530. For example, the second conductive connector 592 may be omitted from the discharge pass E. For example, the discharge pass E may include the cover frame 550, the 1-2 conductive connector 593, the camera flange 540, and the base plate 530. According to this structure, while an electrostatic discharge occurs, the discharge pass E does not pass through the PCB 580 so that the effect of the electrostatic discharge acting on the wiring provided on the PCB 580 may be reduced or eliminated. The stability of the wiring provided on the PCB 580 may be improved.

In an embodiment of the disclosure, the second conductive connector 592 may be disposed between the base plate 530 and the camera flange 540. The second conductive connector 592 may be attached to each of the base plate 530 and the camera flange 540.

In an embodiment of the disclosure, the plurality of adhesive members 599*a* and 599*b* may include the first adhesive member 599*a* and a second adhesive member 599*b*. The first adhesive member 599*a* may connect the cover plate 513 to the cover frame 550. The second adhesive member 599*b* may connect the cover plate 513 to the main body 511.

Figure 9:
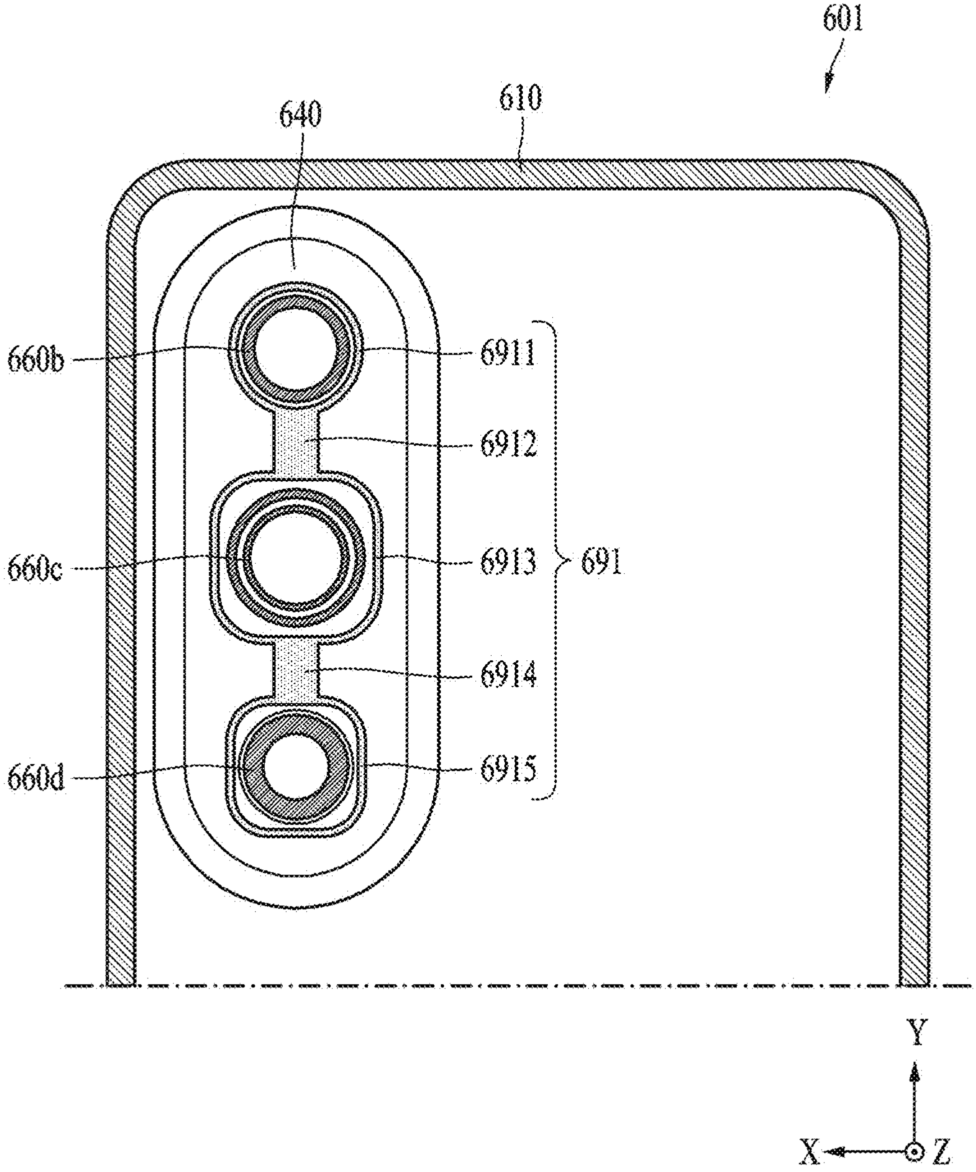
FIG. 9 is a plan view schematically illustrating a camera flange, lens structure, and conductive connector of an electronic device according to an embodiment of the disclosure.

FIG. 9 is a plan view schematically illustrating a camera flange, lens structure, and conductive connector of an electronic device, according to an embodiment of the disclosure.

Referring to FIG. 9, in an embodiment of the disclosure, an electronic device 601 (e.g., the electronic device 101 of FIG. 1) may include a housing 610, a camera flange 640, a plurality of inner lens structures 660*b*, 660*c*, and 660*d*, and a first conductive connector 691.

In an embodiment of the disclosure, the plurality of inner lens structures 660*b*, 660*c*, and 660*d* may be spaced apart from each other. The plurality of inner lens structures 660*b*, 660*c*, and 660*d* may include a first inner lens structure 660*b*, a second inner lens structure 660*c*, and a third inner lens structure 660*d*.

In an embodiment of the disclosure, the first conductive connector 691 may be provided in plurality. For example, the first conductive connector 691 may include a 1-1 conductive connector 6911 that surrounds the first inner lens structure 660*b*, a 1-2 conductive connector 6913 that surrounds the second inner lens structure 660*c*, a 1-3 conductive connector 6915 that surrounds the third inner lens structure 660*d*, a first connecting connector 6912 that connects the 1-1 conductive connector 6911 to the 1-2 conductive connector 6913, and a second connecting connector 6914 that connects the 1-2 conductive connector 6913 to the 1-3 conductive connector 6915.

Figure 10:
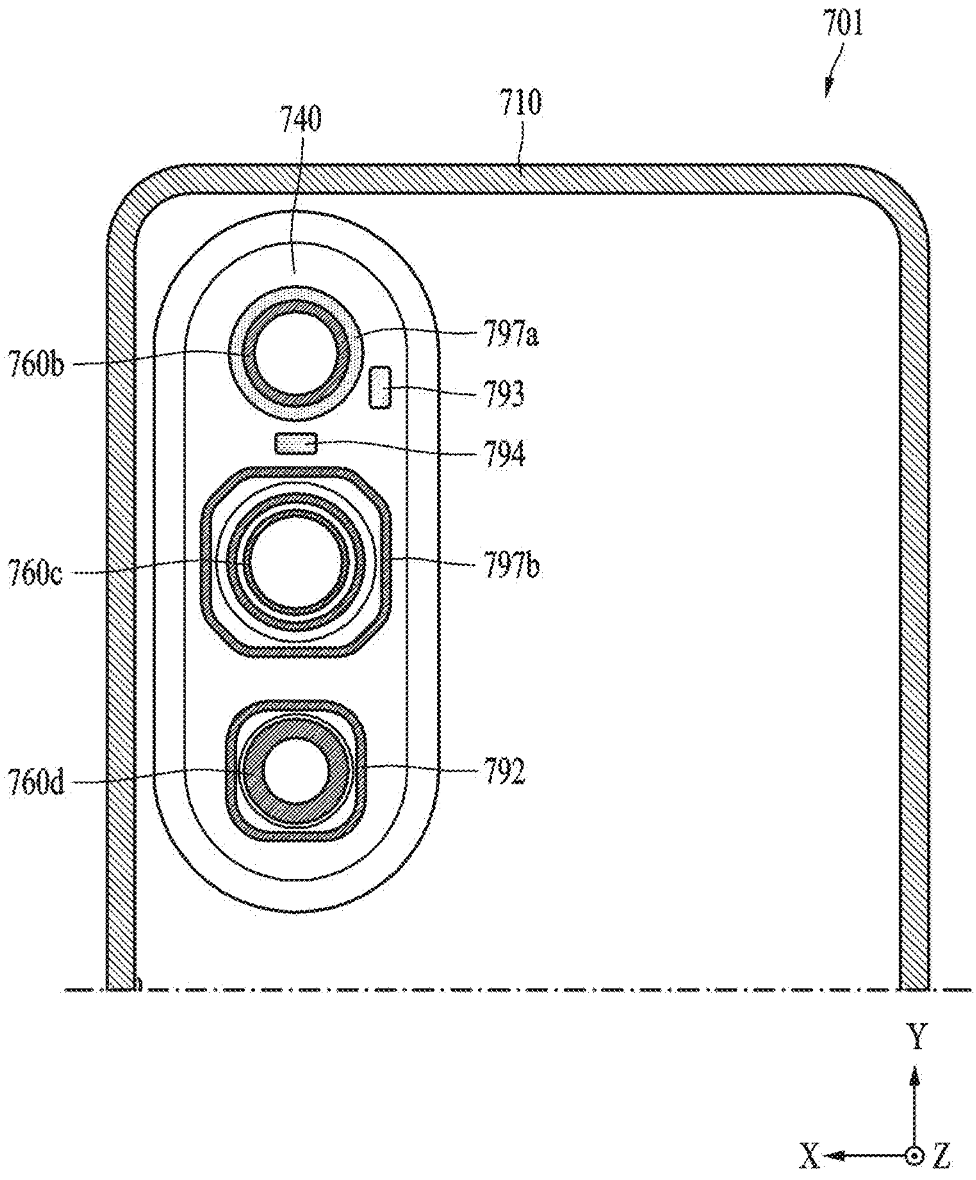
FIG. 10 is a plan view schematically illustrating a camera flange, lens structure, and conductive connector of an electronic device according to an embodiment of the disclosure.

FIG. 10 is a plan view schematically illustrating a camera flange, lens structure, and conductive connector of an electronic device, according to an embodiment of the disclosure.

Referring to FIG. 10, in an embodiment of the disclosure, an electronic device 701 (e.g., the electronic device 101 of FIG. 1) may include a housing 710, a camera flange 740, a plurality of inner lens structures 760*b*, 760*c*, and 760*d*, first conductive connectors 792, 793, and 794, and adhesive sponges 797*a* and 797*b*. The adhesive sponges 797*a* and 797*b* may include a non-conductive material.

In an embodiment of the disclosure, the plurality of inner lens structures 760*b*, 760*c*, and 760*d* may be spaced apart from each other. The plurality of inner lens structures 760*b*, 760*c*, and 760*d* may include a first inner lens structure 760*b*, a second inner lens structure 760*c*, and a third inner lens structure 760*d*.

In an embodiment of the disclosure, the first conductive connectors 792, 793, and 794 may be provided in plurality. For example, the first conductive connectors 792, 793, and 794 may include a 1-1 conductive connector 792 that encloses the third inner lens structure 760*d*, and a 1-2 conductive connector 793 and a 1-3 conductive connector 794, which are provided around the first inner lens structure 760*b*. The 1-1 conductive connector 792, the 1-2 conductive connector 793, and the 1-3 conductive connector 794 may be provided at positions spaced apart from each other.

According to an embodiment of the disclosure, an electronic device may include the main body 411, the housing 410 including the cover plate 413 connected to the main body 411, the base plate 430 disposed on the main body 411, the camera flange 440 disposed on the base plate 430, the cover frame 450 that covers the camera flange 440, the plurality of lens structures 460*a* and 460*b* including the outer lens structure 460*a* connected to the cover frame 450 and the inner lens structure 460*b* connected to the camera flange 440, and the first conductive connector 491 disposed between the cover frame 450 and the camera flange 440, provided in a state compressed by the cover frame 450 and the camera flange 440, and electrically connecting the cover frame 450 to the camera flange 440.

In an embodiment of the disclosure, an electrostatic discharge may occur along the cover frame 450, the first conductive connector 491, the camera flange 440, and the base plate 430.

In an embodiment of the disclosure, the first conductive connector 491 may have elasticity.

In an embodiment of the disclosure, the first conductive connector 491 may include a conductive sponge.

In an embodiment of the disclosure, the first conductive connector 491 may enclose at least a portion of the inner lens structure 460*b*.

In an embodiment of the disclosure, the first conductive connector 491 may have a ring shape.

In an embodiment of the disclosure, the first conductive connector 491 may close a space between the camera flange 440 and the cover frame 450.

In an embodiment of the disclosure, the electronic device may further include the second conductive connector 492 disposed between the base plate 430 and the camera flange 440.

In an embodiment of the disclosure, the first conductive connector 491 and the second conductive connector 492 may include the same material.

In an embodiment of the disclosure, the electronic device may further include the PCB 480 disposed inside the housing 410 and provided not electrically connected to the camera flange 440.

In an embodiment of the disclosure, the PCB 480 may be disposed inside the housing 410 and may be spaced apart from the camera flange 440.

In an embodiment of the disclosure, the first conductive connector 591 may be provided in plurality.

In an embodiment of the disclosure, the inner lens structures 560*b*, 560*c*, and 560*d* may be provided in plurality, and the camera flange 540 may enclose each of the plurality of inner lens structures 560*b*, 560*c*, and 560*d*.

In an embodiment of the disclosure, the first conductive connectors 591 and 593 may be provided in plurality, and the plurality of first conductive connectors 591 and 593 may include the 1-1 conductive connector 591 that surrounds any one of the plurality of inner lens structures 560*b*, 560*c*, and 560*d* and the 1-2 conductive connector 593 provided at a position spaced apart from the 1-1 conductive connector 591.

In an embodiment of the disclosure, a plurality of first conductive connectors 591 and 593, and 691 may further include the connecting connectors 6912 and 6914 that connect the 1-1 conductive connector 591 to the 1-2 conductive connector 593.

According to an embodiment of the disclosure, the electronic device may include the main body 411, the housing 410 including the cover plate 413 connected to the main body 411, the base plate 430 disposed on the main body 411, the camera flange 440 disposed on the base plate 430, the cover frame 450 that covers the camera flange 440, the plurality of lens structures 460*a* and 460*b* including the outer lens structure 460*a* connected to the cover frame 450 and the inner lens structure 460*b* connected to the camera flange 440, and the first conductive connector 491 disposed between the cover frame 450 and the camera flange 440 and provided in a state compressed by the cover frame 450 and the camera flange 440, in which an electrostatic discharge may occur along the cover frame 450, the first conductive connector 491, the camera flange 440, and the base plate 430.

In an embodiment of the disclosure, the first conductive connector 491 may include a conductive sponge.

In an embodiment of the disclosure, the first conductive connector 491 may have a ring shape.

In an embodiment of the disclosure, the electronic device may further include the PCB 480 disposed inside the housing 410 and provided not electrically connected to the camera flange 440.

According to an embodiment of the disclosure, the electronic device may include the main body 411, the housing 410 including the cover plate 413 connected to the main body 411, the base plate 430 disposed on the main body 411, the camera flange 440 disposed on the base plate 430, the cover frame 450 that covers the camera flange 440, the plurality of lens structures 460*a* and 460*b* including the outer lens structure 460*a* connected to the cover frame 450 and the inner lens structure 460*b* connected to the camera flange 440, and the first conductive connector 491 disposed between the cover frame 450 and the camera flange 440, having elasticity, provided in a state compressed by the cover frame 450 and the camera flange 440, electrically connecting the cover frame 450 to the camera flange 440, and having a ring shape, in which an electrostatic discharge may occur along the cover frame 450, the first conductive connector 491, the camera flange 440, and the base plate 430.

The effects of the electronic device according to embodiments are not limited to the above-mentioned effects, and other unmentioned effects can be clearly understood from the following description by one of ordinary skill in the art.

It will be appreciated that various embodiments of the disclosure according to the claims and description in the specification can be realized in the form of hardware, software or a combination of hardware and software.

Any such software may be stored in non-transitory computer readable storage media. The non-transitory computer readable storage media store one or more computer programs (software modules), the one or more computer programs include computer-executable instructions that, when executed by one or more processors of an electronic device, cause the electronic device to perform a method of the disclosure.

Any such software may be stored in the form of volatile or non-volatile storage such as, for example, a storage device like read only memory (ROM), whether erasable or rewritable or not, or in the form of memory such as, for example, random access memory (RAM), memory chips, device or integrated circuits or on an optically or magnetically readable medium such as, for example, a compact disk (CD), digital versatile disc (DVD), magnetic disk or magnetic tape or the like. It will be appreciated that the storage devices and storage media are various embodiments of non-transitory machine-readable storage that are suitable for storing a computer program or computer programs comprising instructions that, when executed, implement various embodiments of the disclosure. Accordingly, various embodiments provide a program comprising code for implementing apparatus or a method as claimed in any one of the claims of this specification and a non-transitory machine-readable storage storing such a program.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:

a housing comprising a main body and a cover plate connected to the main body;

a base plate disposed on the main body;

a camera flange disposed on the base plate;

a cover frame configured to cover the camera flange;

a plurality of lens structures comprising outer lens structures connected to the cover frame and inner lens structures connected to the camera flange; and first conductive connectors disposed between the cover frame and the camera flange and electrically connecting the cover frame to the camera flange.

2. The electronic device of claim 1, wherein an electrostatic discharge is capable of being generated along the cover frame, the first conductive connectors, the camera flange, and the base plate.

3. The electronic device of claim 1, wherein the first conductive connectors have elasticity and are provided in a state compressed by the cover frame and the camera flange.

4. The electronic device of claim 1, wherein the first conductive connectors comprise a conductive sponge.

5. The electronic device of claim 1, wherein the first conductive connectors enclose at least a portion of the inner lens structures.

6. The electronic device of claim 1, wherein the first conductive connectors have a ring shape.

7. The electronic device of claim 1, wherein the first conductive connectors close a space between the camera flange and the cover frame.

8. The electronic device of claim 1, further comprising:

second conductive connectors disposed between the base plate and the camera flange.

9. The electronic device of claim 8, wherein the first conductive connectors and the second conductive connectors and comprise same material.

10. The electronic device of claim 1, further comprising:

a printed circuit board (PCB) disposed inside the housing and provided not electrically connected to the camera flange.

11. The electronic device of claim 10, wherein the PCB is disposed inside the housing and spaced apart from the camera flange.

12. The electronic device of claim 1, wherein first conductive connectors are provided in plurality.

13. The electronic device of claim 12, wherein the inner lens structures are provided in plurality, and wherein a camera flange encloses each of the plurality of the inner lens structures.

14. The electronic device of claim 13, wherein the first conductive connectors are provided in plurality, and wherein the first conductive connectors provided in plurality comprise:

a 1-1 conductive connector that surrounds one of the plurality of the inner lens structures, and a 1-2 conductive connector provided at a position spaced apart from the 1-1 conductive connector.

15. The electronic device of claim 14, wherein the first conductive connectors further comprise connection connectors that connect the 1-1 conductive connector to the 1-2 conductive connector.

16. An electronic device comprising:

a housing comprising a main body and a cover plate connected to the main body;

a base plate disposed on the main body;

a camera flange disposed on the base plate;

a cover frame configured to cover the camera flange;

a plurality of lens structures comprising outer lens structures connected to the cover frame and inner lens structures connected to the camera flange; and first conductive connectors disposed between the cover frame and the camera flange and provided in a state compressed by the cover frame and the camera flange, wherein an electrostatic discharge is capable of being generated along the cover frame, the first conductive connectors, the camera flange, and the base plate.

17. The electronic device of claim 16, wherein the first conductive connectors comprise a conductive sponge.

18. The electronic device of claim 16, wherein the first conductive connectors have a ring shape.

19. The electronic device of claim 16, further comprising:

a printed circuit board (PCB) disposed inside the housing and provided not electrically connected to the camera flange.

20. An electronic device comprising:

a housing comprising a main body and a cover plate connected to the main body;

a base plate disposed on the main body;

a camera flange disposed on the base plate;

a cover frame configured to cover the camera flange;

a plurality of lens structures comprising outer lens structures connected to the cover frame and inner lens structures connected to the camera flange; and first conductive connectors disposed between the cover frame and the camera flange, having elasticity, provided in a state compressed by the cover frame and the camera flange, electrically connecting the cover frame to the camera flange, and having a ring shape, wherein an electrostatic discharge is capable of being generated along the cover frame, the first conductive connectors, the camera flange, and the base plate.

* * * * *